(12) United States Patent
Lee

(10) Patent No.: US 11,127,897 B2
(45) Date of Patent: Sep. 21, 2021

(54) NONVOLATILE MEMORY CELLS HAVING AN EMBEDDED SELECTION ELEMENT AND NONVOLATILE MEMORY CELL ARRAYS INCLUDING THE NONVOLATILE MEMORY CELLS

(71) Applicants: SK hynix Inc., Gyeonggi-do (KR); Sang Min Lee, Gyeongsangbuk-do (KR)

(72) Inventor: Sang Min Lee, Gyeongsangbuk-do (KR)

(73) Assignees: SK hynix Inc., Gyeonggi-do (KR); Sang Min Lee, Gyeongsangbuk-do (KR)

( * ) Notice: Subject to any disclaimer, the term of this patent is extended or adjusted under 35 U.S.C. 154(b) by 0 days.

(21) Appl. No.: 16/891,291

(22) Filed: Jun. 3, 2020

(65) Prior Publication Data

US 2021/0066585 A1    Mar. 4, 2021

(30) Foreign Application Priority Data

Sep. 2, 2019    (KR) .................. 10-2019-0108478

(51) Int. Cl.
*G11C 13/00* (2006.01)
*H01L 45/00* (2006.01)

(52) U.S. Cl.
CPC ........ *H01L 45/1206* (2013.01); *G11C 13/004* (2013.01); *G11C 13/0069* (2013.01); *G11C 13/0097* (2013.01); *H01L 45/1273* (2013.01); *G11C 2013/0045* (2013.01); *G11C 2013/0071* (2013.01); *G11C 2213/53* (2013.01); *H01L 45/06* (2013.01); *H01L 45/08* (2013.01); *H01L 45/1226* (2013.01)

(58) Field of Classification Search
None
See application file for complete search history.

(56) References Cited

U.S. PATENT DOCUMENTS

| | | | | |
|---|---|---|---|---|
| 5,804,484 A * | 9/1998 | Wen | ............... | H01L 27/11226 257/E21.669 |
| 9,515,172 B2 * | 12/2016 | Shin | ............... | H01L 29/66545 |
| 2007/0090452 A1 * | 4/2007 | Cho | ............... | H01L 21/823425 257/330 |
| 2013/0294154 A1 * | 11/2013 | Kang | ............... | G11C 13/0004 365/163 |
| 2017/0162576 A1 * | 6/2017 | Kim | ............... | H01L 27/1211 |
| 2018/0182795 A1 * | 6/2018 | Kim | ............... | H01L 27/14616 |

FOREIGN PATENT DOCUMENTS

KR    10-2016-0121729    10/2016

* cited by examiner

*Primary Examiner* — Tan T. Nguyen
(74) *Attorney, Agent, or Firm* — IP & T Group LLP

(57) ABSTRACT

A nonvolatile memory cell includes a semiconductor layer including a first recess and a second recess. A first gate insulation layer is disposed on a bottom surface and side surfaces of the first recess. A second gate insulation layer is disposed on a bottom surface and side surfaces of the second recess. A variable resistive material layer is disposed on a first region of the semiconductor layer disposed between the first and second recesses. An insulation barrier layer disposed on a top surface and side surfaces of the variable resistive material layer. A gate electrode surrounding the insulation barrier layer and extending to fill the first and second recesses.

19 Claims, 23 Drawing Sheets

NONVOLATILE MEMORY CELLS HAVING AN EMBEDDED SELECTION ELEMENT AND NONVOLATILE MEMORY CELL ARRAYS INCLUDING THE NONVOLATILE MEMORY CELLS

CROSS-REFERENCE TO RELATED APPLICATIONS

The present application claims priority under 35 U.S.C. 119(a) to Korean Application No. 10-2019-0108478, filed on Sep. 2, 2019, which is herein incorporated by reference in its entirety.

BACKGROUND

1. Technical Field

Various embodiments of the present disclosure generally relate to nonvolatile memory devices and, more particularly, to nonvolatile memory cells having an embedded selection element and nonvolatile memory cell arrays including the nonvolatile memory cells.

2. Related Art

Recently, memory devices having a large memory capacity and a high integration density have been required with the development of multi-functional information/communication systems. As memory cells of the memory devices are scaled down to increase the integration density of the memory devices, structures of internal circuits and/or interconnection lines included in the memory devices have become more difficult to manufacture. Thus, various improved techniques and structures are being developed for providing improved memory devices exhibiting an improved balance of high performance, reliability, and high integration density.

SUMMARY

According to an embodiment, a nonvolatile memory cell includes a semiconductor layer including a first recess and a second recess. A first gate insulation layer is disposed on a bottom surface and side surfaces of the first recess. A second gate insulation layer is disposed on a bottom surface and side surfaces of the second recess. A variable resistive material layer is disposed on a first region of the semiconductor layer disposed between the first and second recesses. An insulation barrier layer disposed on a top surface and side surfaces of the variable resistive material layer. A gate electrode surrounding the insulation barrier layer and extending to fill the first and second recesses.

According to another embodiment, a nonvolatile memory cell includes a gate terminal, a source terminal and a drain terminal which are coupled to a word line, a source line and a bit line, respectively. A resistor is coupled between the source terminal and the drain terminal and comprises a variable resistive material layer. A first channel region is provided between the resistor and the source terminal, and a second channel region is provided between the resistor and the drain terminal. Whether a first channel and a second channel are formed in the first and second channel regions, respectively, is determined according to a word line voltage applied to the word line.

According to yet another embodiment, a nonvolatile memory cell includes a semiconductor layer having a first region having a first surface height, a second region located at a first side of the first region, and a third region located at a second side of the first region opposite to the second region. The second and third regions have a second surface height to provide a trench on the first region between the second and third regions. A first gate insulation layer includes a first vertical gate insulation layer disposed on a first side surface of the trench adjacent to the second region, and a first horizontal gate insulation layer extending from the first vertical gate insulation layer onto a bottom surface of the trench. A second gate insulation layer includes a second vertical gate insulation layer disposed on a second side surface of the trench adjacent to the third region, and a second horizontal gate insulation layer extending from the second vertical gate insulation layer onto the bottom surface of the trench. A variable resistive material layer is disposed between the first horizontal gate insulation layer and the second horizontal gate insulation layer. An insulation barrier layer is disposed on an entire portion of a top surface and portions of side surfaces of the variable resistive material layer. A gate electrode surrounds the insulation barrier layer and extends to fill the trench. A first impurity diffusion region is disposed in an upper portion of the second region of the semiconductor layer, and a second impurity diffusion region is disposed in an upper portion of the third region of the semiconductor layer.

According to still another embodiment, a nonvolatile memory cell array includes a first word line coupled to a first unit cell and a second unit cell, a second word line coupled to a third unit cell and a fourth unit cell, a first source line coupled to the first and third unit cells, a second source line coupled to the second and fourth unit cells, and a bit line coupled to the first to fourth unit cells. Each of the first to fourth unit cells includes a gate terminal coupled to any one of the first and second word lines, a source terminal coupled to any one of the first and second source lines, a drain terminal coupled to the bit line, a resistor coupled between the source terminal and the drain terminal and comprised of a variable resistive material layer, a first channel region provided between the resistor and the source terminal, and a second channel region provided between the resistor and the drain terminal. Whether a first channel and a second channel are formed in the first and second channel regions, respectively, is determined according to a voltage applied to the gate terminal.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and describe various principles and advantages of those embodiments.

DETAILED DESCRIPTION OF THE EMBODIMENTS

For the following description of embodiments, it will be understood that the terms "first" and "second" are intended to identify an element, but are not used to define the element itself or imply a particular sequence or hierarchy. In addition, when an element is referred to as being located "on," "over," "above," "under," or "beneath" another element, a relative positional relationship is indicated, regardless of the presence or absence of intervening elements. Accordingly, the terms such as "on," "over," "above," "under," "beneath," "below," and the like that are used herein are for the purpose of describing particular embodiments only and are not intended to limit the scope of the present disclosure. Further, when elements are referred to as being "connected" or "coupled" to one another, the elements may be electrically or mechanically connected, or coupled directly without intervening elements or indirectly with intervening elements.

Various embodiments are directed to nonvolatile memory cells having an embedded selection element and nonvolatile memory cell arrays including the nonvolatile memory cells.

Figure 1:
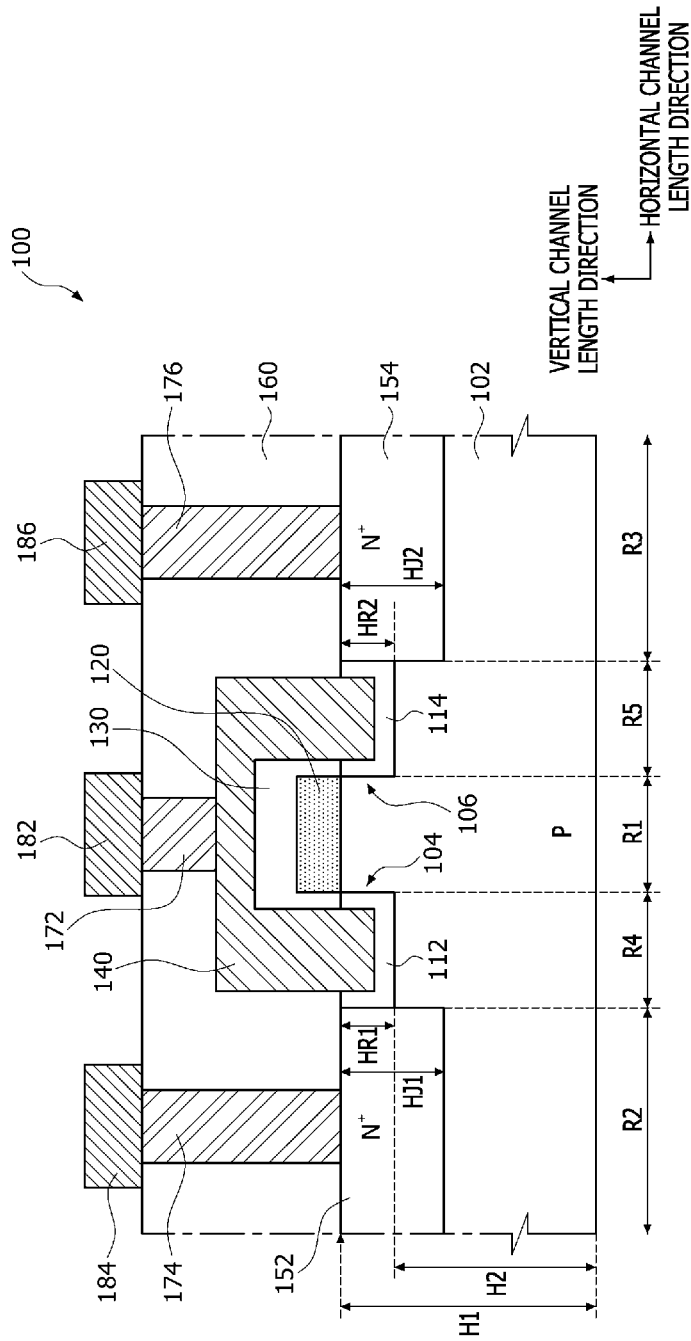
FIG. 1 is a cross-sectional view illustrating a nonvolatile memory cell according to an embodiment of the present disclosure.

FIG. 1 is a cross-sectional view illustrating a nonvolatile memory cell 100 according to an embodiment of the present disclosure. Referring to FIG. 1, the nonvolatile memory cell 100 may include a semiconductor layer 102. In an embodiment, the semiconductor layer 102 may correspond to a semiconductor substrate, but not limited thereto. For example, in some other embodiments, the semiconductor layer 102 may be a well region disposed in an upper portion of the semiconductor substrate or an epitaxial layer disposed on the upper portion of the semiconductor substrate. The semiconductor layer 102 may have a first type conductivity, for example, a P-type conductivity. In an embodiment, the semiconductor layer 102 may be made of or include a silicon layer or a germanium layer. Alternatively, the semiconductor layer 102 may include a Group III-V compound layer such as a gallium nitride (GaN) layer.

The semiconductor layer 102 may include a first region R1, a second region R2, a third region R3, a fourth region R4 and a fifth region R5 which are distinguished from each other along a horizontal channel length direction (i.e., a horizontal direction in FIG. 1). The second and third regions R2 and R3 may be disposed to be symmetrical to each other with respect to the first region R1 located at a central portion of the first to fifth regions R1~R5. In addition, the fourth and fifth regions R4 and R5 may also be disposed to be symmetrical to each other with respect to the first region R1. That is, the fourth and fifth regions R4 and R5 may be disposed at both sides of the first region R1, respectively, the second region R2 may be disposed at one side of the fourth region R4 opposite to the first region R1, and the third region R3 may be disposed at one side of the fifth region R5 opposite to the first region R1. The second, fourth, first, fifth and third regions R2, R4, R1, R5 and R3 may be sequentially arrayed in the horizontal channel length direction along the horizontal channel length direction.

A first recess 104 may be disposed in the fourth region R4 of the semiconductor layer 102, and a second recess 106 may be disposed in the fifth region R5 of the semiconductor layer 102. The first recess 104 may have a first recess depth HR1, and the second recess 106 may have a second recess depth HR2. In an embodiment, the first recess depth HR1 may be equal or substantially equal to the second recess depth HR2. As a result, upper portions of the first, second and third regions R1, R2 and R3 of the semiconductor layer 102 may upwardly protrude to a level that is above the top surfaces of the fourth and fifth regions R4 and R5 of the semiconductor layer 102. In the first, second and third regions R1, R2 and R3, the semiconductor layer 102 may have a first surface height H1. In the fourth and fifth regions R4 and R5, the semiconductor layer 102 may have a second surface height H2. The first surface height H1 is the distance between the bottom surface and the top surface of the semiconductor layer 102 in the second and third regions R2 and R3. The second surface height H2 is the distance between the bottom surface and the top surface of the semiconductor layer 102 in the fourth and fifth regions R4 and R5. The bottom surfaces of the first to fifth regions R1~R5 may be located at the same horizontal level. The bottom surfaces of the first to fifth regions R1~R5 may define the bottom surface of the semiconductor layer 102. The first surface height H1 may be greater than the second surface height H2 by a distance equal to the first recess depth HR1 (or the second recess depth HR2). The top surfaces of the semiconductor layer 102 in each of the first to fifth regions R1~R5 may each have a planar structure. More specifically, top surfaces of the first to third regions R1, R2 and R3 of the semiconductor layer 102 may be located at the same horizontal level to provide a planar structure, and top surfaces of the fourth and fifth regions R4 and R5 of the semiconductor layer 102 may be located at the same horizontal level to provide a planar structure. In addition, bottom surfaces of the first to fifth regions R1~R5 of the semiconductor layer 102 may be located at the same horizontal level to provide a planar structure.

In the fourth region R4, a first gate insulation layer 112 may be disposed on the bottom surface and side surfaces of the first recess 104. A first vertical channel region may be provided in the semiconductor layer 102 adjacent to the side surface of the first recess 104 abutting the second region R2, and a first horizontal channel region may be provided in the semiconductor layer 102 adjacent to the bottom surface of the first recess 104. If an inversion layer having a different conductivity type from the semiconductor layer 102 is formed in the first vertical channel region and the first horizontal channel region, the inversion layer may act as a first channel. In the fifth region R5, a second gate insulation layer 114 may be disposed on the bottom surface and side surfaces of the second recess 106. A second vertical channel region may be provided in the semiconductor layer 102 adjacent to the side surface of the second recess 106 abutting the third region R3, and a second horizontal channel region may be provided in the semiconductor layer 102 adjacent to the bottom surface of the second recess 106. If an inversion layer having a different conductivity type from the semiconductor layer 102 is formed in the second vertical channel region and the second horizontal channel region, the inversion layer may act as a second channel. The first and second gate insulation layers 112 and 114 may be formed of the same insulation layer. In an embodiment, the first and second gate insulation layers 112 and 114 may be made of or include a silicon oxide ($SiO_2$) layer. The first and second gate insulation layers 112 and 114 may have the same thickness or substantially the same thickness. The first and second gate insulation layers 112 and 114 may be formed at the same time using a single process.

A variable resistive material layer 120 may be disposed on the top surface of the semiconductor layer 102 in the first region R1. The entire bottom surface of the variable resistive material layer 120 may be in direct contact with the entire top surface of the first region R1 of the semiconductor layer 102. In an embodiment, the variable resistive material layer 120 may be made of a resistive dielectric material. The resistance value (i.e., resistive state) of the variable resistive material layer 120 may vary according to a voltage pulse applied to the variable resistive material layer 120. The resistive dielectric material layer 120 may be any of a metal oxide material layer such as a hafnium oxide (HfOx) layer, a tantalum oxide (TaOx) layer, a titanium oxide (TiOx) layer, an aluminum oxide (AlOx) layer or a vanadium oxide (VOx) layer. The metal oxide material layer 120 may have an oxygen composition "x" in an upper portion thereof that is different from an oxygen composition "x" in a lower portion thereof. For example, an oxygen composition "x" in a lower portion of the metal oxide material layer may be greater than an oxygen composition "x" in an upper portion of the metal oxide material layer. In an embodiment, the oxygen concentration of the metal oxide material layer 120 may vary from a higher concentration at the bottom surface of the metal oxide material layer 120 to a lower concentration at the top surface of the metal oxide material layer 120. The oxygen concentration change may be gradual or stepwise. In another embodiment, the variable resistive material layer 120 may be made of a phase changeable material having a resistance value (i.e., resistive state) which may vary according to a current flowing through the variable resistive material layer 120. For example, the variable resistive material layer 120 may be a chalcogenide material layer whose resistive state is changed into a crystalline state or an amorphous state according to a temperature variation. In an embodiment, the chalcogenide material layer may be an alloy of germanium (Ge), stibium (Sb) and tellurium (Te), which is called a GST layer.

An insulation barrier layer 130 may be disposed on the top surface and side surfaces of the variable resistive material layer 120. The insulation barrier layer 130 may be formed to surround the variable resistive material layer 120 except for the bottom surface of the variable resistive material layer 120 which is in direct contact with the semiconductor layer 102. The insulation barrier layer 130 may be a single layer as illustrated in FIG. 1. However, the invention may not be limited in this way. For example, although not shown in the drawings, the insulation barrier layer 130 may include a plurality of insulation layers. In an embodiment, the insulation barrier layer 130 may be made or comprise of the same material as the first and second gate insulation layers 112 and 114. In an embodiment, the insulation barrier layer 130 may be made of or include a silicon oxide ($SiO_2$) layer. In an embodiment, the thickness (in the horizontal channel length direction) of the insulation barrier layer 130 which is disposed on the side surfaces of the variable resistive material layer 120 may be equal or substantially equal to the thickness (in the horizontal channel length direction) of the first and second gate insulation layers 112 and 114 disposed on the side surfaces of the first and second recesses 104 and 106. In an embodiment, the thickness of the insulation barrier layer 130 in the vertical direction may be the same as or greater than the thickness of the insulation barrier layer 130 in the horizontal channel length direction. The insulation barrier layer 130 disposed on the side surfaces of the variable resistive material layer 120 may be disposed in the fourth and fifth regions R4, R5 of the semiconductor layer 102. Hence, the insulation barrier layer 130 is formed on the top surface of the variable resistive material layer 120 and may overlap fully with the first region and extend over to only partially overlap with the fourth and fifth regions R4, R5 of the semiconductor layer 102. The insulation barrier layer 130 forms a Π shape structure as illustrated in FIG. 1, with the legs of the Π disposed over the fourth and fifth regions R4, R5 of the semiconductor layer 102.

A gate electrode 140 may be disposed on the first, fourth and fifth regions R1, R4 and R5 of the semiconductor layer 102. The gate electrode 140 may be formed to surround the insulation barrier layer 130. The gate electrode 140 may also extend to fill the first and second recesses 104, 106 on the first and second gate insulation layers 112, and 114, respectively. On the first region R1, the gate electrode 140 may be disposed on the top surface of the insulation barrier layer 130. On the fourth region R4, the gate electrode 140 may be disposed to fill the first recess 104 and to surround a first side of the insulation barrier layer 130. On the fifth region R5, the gate electrode 140 may be disposed to fill the second recess 106 and to surround a second side of the insulation barrier layer 130. Inside of each of the first and second recesses 104, 106, the gate electrode 140 may be formed on the first and second gate insulation layers, respectively, to fill the recesses 104, 106. The gate electrode 140 may have a Π shape with the legs of the Π shape filling the respective recesses 104, 106 and extending vertically to cover the side walls of the first and second gate insulation layers 112, 114, respectively and the Π shape insulation barrier layer 130. The gate electrode 140 may be made of any suitable conductive material. In an embodiment, the gate electrode 140 may be made or include a doped polysilicon. In an embodiment, the gate electrode 140 may be made or include a metal. The gate electrode 140 may be formed of a single layer, such as a single metal layer or a single doped polysilicon layer. However, the invention may not be limited in this way. For example, in an embodiment, the gate electrode 140 may be formed of two or more layers, including doped polysilicon layers, metal layers and/or combinations thereof. The thickness of the legs of the Π shape gate electrode 140 may be greater than the thickness of the top part of the Π shape gate electrode 140.

A first impurity diffusion region 152 may be disposed in an upper portion of the second region R2 of the semiconductor layer 102. The first impurity diffusion region 152 may be formed to cover the entire top surface of the semiconductor layer 102 in the second region R2 and may extend to a depth HJ1 inside the semiconductor layer 102. A second impurity diffusion region 154 may be disposed in an upper portion of the third region R3 of the semiconductor layer 102. The second impurity diffusion region 154 may be formed to cover the entire top surface of the semiconductor layer 102 in the fourth region R4 and may extend to a depth HJ2 inside the semiconductor layer 102. The first and second impurity diffusion regions 152 and 154 may have a conductivity type which is different from or opposite to a conductivity type of the semiconductor layer 102. For example, when the semiconductor layer 102 is a P-type semiconductor layer, the first and second impurity diffusion regions 152 and 154 may be N-type regions which are heavily doped with N-type impurities. The depth HJ1 of the first impurity diffusion region 152 may be referred to hereinafter as the first junction depth HJ1. The first junction depth HJ1 may be measured from the top surface of the second region R2 of the semiconductor layer 102. The second depth HJ2 of the second impurity diffusion region 154 may be measured from the top surface of the third region R3 of the semiconductor layer 102 and may be referred to hereinafter as the second junction depth HJ2. The first junction depth HJ1 may be equal or substantially equal to the second junction depth HJ2. The first and second junction depths HJ1 and HJ2 may be greater than the first recess depth HR1 and the second recess depth HR2 of the first and second recesses 104 and 106. Stated otherwise, the bottom surfaces of the first and second impurity regions 152, 154 may be at a lower level than the bottom surfaces of the first and second recesses 104, 106. The first and second recesses 104, and 106 may have inner sides abutting the first region, and outer sides abutting the second and third regions R2, R3, respectively. The first impurity diffusion region 152 may be formed immediately adjacent to the first recess 104 so that the outer side of the recess 104 may abut the first impurity region 152. The second impurity diffusion region 154 may be formed immediately adjacent to the second recess 106 so that the outer side of the recess 106 may abut the second impurity region 154.

The first and second impurity regions 152, 154 may be formed by any suitable implantation process and care should be exercised to ensure that the bottom surfaces of the first and second impurity regions 152, 154 are at lower level than the bottom surfaces of the first and second recesses 104, 106.

An interlayer insulation layer 160 may be disposed on the exposed surfaces of the gate electrode 140, the first and second gate insulation layers 112 and 114, and the first and second impurity diffusion regions 152 and 154. The interlayer insulation layer 160 may have first to third via holes therein. The first to third via holes may penetrate the interlayer insulation layer 160 to expose the gate electrode 140, the first impurity diffusion region 152 and the second impurity diffusion region 154, respectively. The first via hole may be filled with a first contact plug 172 which is electrically connected to the gate electrode 140. The first contact plug 172 may be disposed centrally above the gate electrode 140. The second via hole may be filled with a second contact plug 174 which is electrically connected to the first impurity diffusion region 152. The second contact plug 174 may be disposed centrally above the first impurity region 152. The third via hole may be filled with a third contact plug 176 which is electrically connected to the second impurity diffusion region 154. The third contact plug 176 may be disposed centrally above the second impurity diffusion region 154. The first to third contact plugs 172, 174 and 176 may each be formed of any suitable conductive material. In an embodiment, the first to third contact plugs 172, 174 and 176 may be formed of or comprised of a metal. The first to third contact plugs 172, 174 and 176 may each have the shape of elongated pillars extending in a vertical direction. The second and third contact plugs 174 and 176 may have the same shape and dimensions. The first contact plug 172 may have the same thickness (in the horizontal direction) as the second and third contact plugs 174, 176 but may be shorter in height (dimension in the vertical direction) than the second and third contact plugs 174, 176. The second and third contact plugs 174, 176 may be positioned symmetrically with respect to the first contact plug. A first electrode 182, a second electrode 184 and a third electrode 186 may be disposed on the interlayer insulation layer 160. The first electrode 182 may be electrically connected to the first contact plug 172. The second electrode 184 may be electrically connected to the second contact plug 174. The third electrode 186 may be electrically connected to the third contact plug 176. The first, second, and third electrodes 182, 184, 186 may be disposed above the interlayer insulation layer 160 and may be in direct contact with the first, second, and third contact plugs 172, 174, 176. The first, second, and third electrodes 182, 184, 186 may have the same shape and size as illustrated in FIG. 1. However, the present invention may not be limited in this way.

Figure 2:
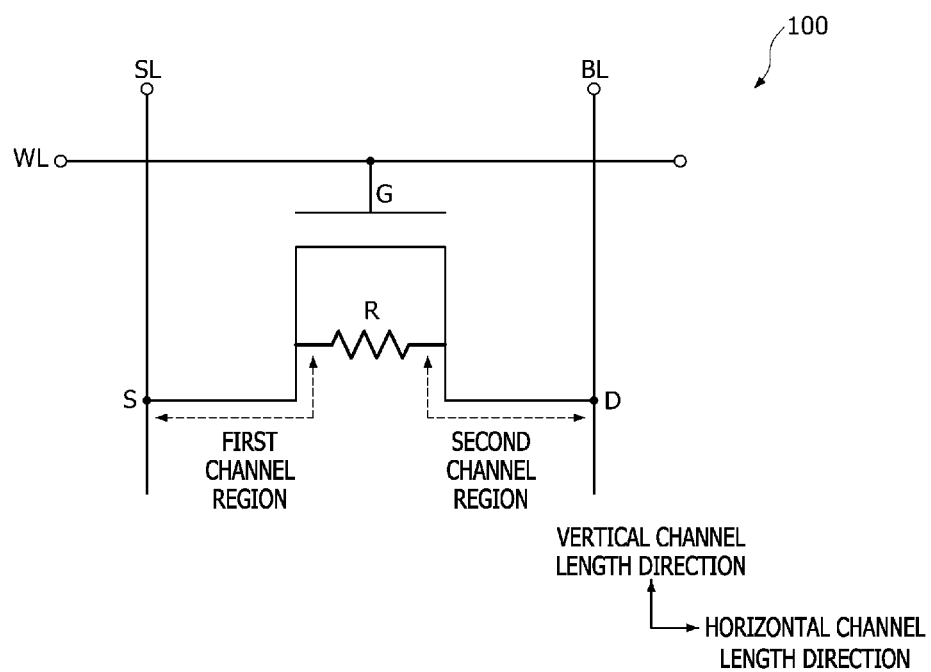
FIG. 2 is an equivalent circuit illustrating a nonvolatile memory cell according to an embodiment of the present disclosure.

FIG. 2 is an equivalent circuit of the nonvolatile memory cell 100 illustrated in FIG. 1. Referring to FIGS. 1 and 2, the nonvolatile memory cell 100 may have a structure similar to a metal-oxide-semiconductor (MOS) structure including a gate terminal G, a source terminal S and a drain terminal D. Unlike a general MOS structure, the nonvolatile memory cell 100 according to an embodiment may include the first and second channel regions which are spaced apart from each other and a resistor R which is disposed between the first and second channel regions. The resistor R may be realized using the variable resistive material layer 120 illustrated in FIG. 1. The gate terminal G corresponding to the gate electrode 140 may be electrically coupled to a word line WL. The source terminal S corresponding to the first impurity diffusion region 152 may be electrically coupled to a source line SL. The drain terminal D corresponding to the second impurity diffusion region 154 may be electrically coupled to a bit line BL. The first channel region may be coupled between the source terminal S and one end of the resistor R. The second channel region may be coupled between the drain terminal D and the other end of the resistor R.

In the nonvolatile memory cell 100, when first and second channels corresponding to inversion layers of the semiconductor layer 102 are formed in respective ones of the first and second channel regions, and the resistor R has a low resistive state, a current path may be provided between the source terminal S and the drain terminal D. Even though the first and second channels are formed in respective ones of the first and second channel regions, no current path is provided between the source terminal S and the drain terminal D if the resistor R has a high resistive state. In addition, even though the resistor R has a low resistive state, no current path is provided between the source terminal S and the drain terminal D if no channel is formed in the first and second channel regions. In an embodiment, the resistor R may have at least one medium resistive state between the low resistive state and the high resistive state. In such a case, the nonvolatile memory cell 100 may function as a multi-level cell.

The resistor R may indicate a binary number "0" or a binary number "1" according to a resistive state thereof. In an embodiment, the resistor R may indicate a binary number "0" when the resistor R has a low resistive state, and the resistor R may indicate a binary number "1" when the resistor R has a high resistive state. An operation (i.e., a set operation or a reset operation) for determining a resistive state of the resistor R may be performed by applying a voltage pulse to the resistor R through the source line SL and the bit line BL. In addition, a read operation for reading out the resistive state of the resistor R may be achieved by discriminating whether current flows through the bit line BL, the resistor R and the source line SL. In an embodiment, the read operation may be achieved by sensing an amount of current flowing through the bit line BL, the resistor R and the source line SL. In such a case, the nonvolatile memory cell 100 may function as a multi-level cell according to the distribution of the amount of current flowing through the bit line BL, the resistor R and the source line SL. The set operation, the reset operation and the read operation of the nonvolatile memory cell 100 may be performed only when both of the first and second channels corresponding to inversion layers of the semiconductor layer 102 are formed in the first and second channel regions. Formation of the first and second channels may be determined according to a word line voltage (VWL of FIG. 3) applied to the word line WL (i.e., the gate terminal G). That is, in order to perform the set operation, the reset operation and the read operation of the nonvolatile memory cell 100, the nonvolatile memory cell 100 has to be selected and the selection of the nonvolatile memory cell 100 may be achieved by applying an appropriate word line voltage to the word line WL.

Figure 3:
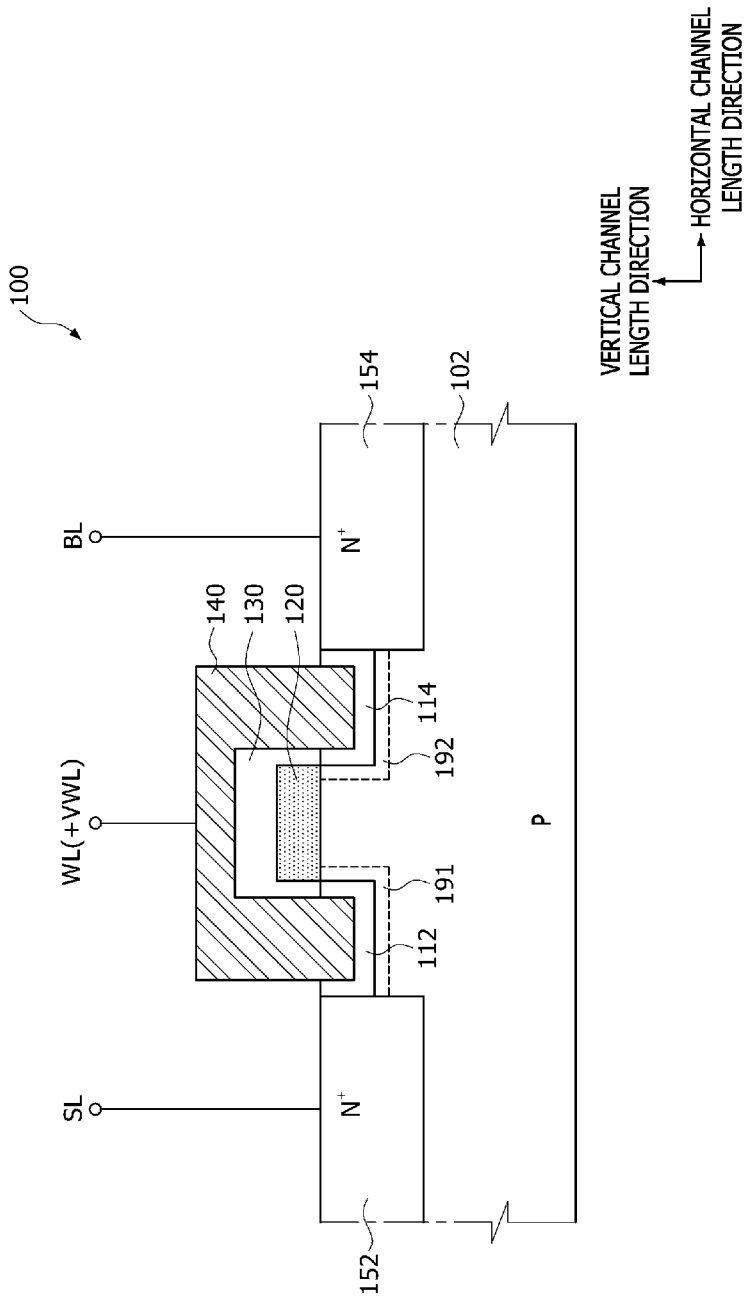
FIG. 3 is a cross-sectional view illustrating a cell selection operation of a nonvolatile memory cell according to an embodiment of the present disclosure.

FIG. 3 is a cross-sectional view illustrating a cell selection operation of the nonvolatile memory cell 100 shown in FIGS. 1 and 2. In FIG. 3, the same reference numerals and symbols as used in FIGS. 1 and 2 denote the same elements. In FIG. 3, the illustration of the interlayer insulation layer 160 of FIG. 1, the first to third contact plugs 172, 174 and 176 of FIG. 1, and the first to third electrodes 182, 184 and 186 of FIG. 1 is omitted, and the word line WL, the source line SL and the bit line BL are illustrated as voltage application lines. Referring to FIG. 3, the cell selection operation of the nonvolatile memory cell 100 may be achieved according to a magnitude of the word line voltage VWL applied to the word line WL. A polarity of the word line voltage VWL may be set to be different according to whether the nonvolatile memory cell 100 has an N-channel structure or a P-channel structure.

The cell selection operation of the nonvolatile memory cell 100 will be described hereinafter for a case that the nonvolatile memory cell 100 has an N-channel structure (i.e., the semiconductor layer 102 has a P-type conductivity and the first and second impurity diffusion regions 152 and 154 have an N-type conductivity). In such a case, in order to select the nonvolatile memory cell 100, a positive word line voltage +VWL that is higher than a threshold voltage of the nonvolatile memory cell 100 having a MOS structure may be applied to the word line WL. When the positive word line voltage +VWL is applied to the word line WL, a first channel 191 having an N-type conductivity may be formed in the P-type semiconductor layer 102 adjacent to the bottom surface and the side surfaces of the first gate insulation layer 112. In addition, when the positive word line voltage +VWL is applied to the word line WL, a second channel 192 having an N-type conductivity may also be formed in the P-type semiconductor layer 102 adjacent to the bottom surface and the side surfaces of the second gate insulation layer 114. Thus, the first channel 191 may act as a current path between the first impurity diffusion region 152 and one end of the variable resistive material layer 120. Similarly, the second channel 192 may also act as a current path between the second impurity diffusion region 154 and the other end of the variable resistive material layer 120. If an appropriate bias is applied between the source line SL and the bit line BL while the positive word line voltage +VWL is applied to the word line WL, any one of the set operation, the reset operation and the read operation may be performed.

In order that the nonvolatile memory cell 100 is not selected, a word line voltage (e.g., a ground voltage) lower than the threshold voltage of the nonvolatile memory cell 100 having a MOS structure may be applied to the word line WL. Under this bias condition, no channel is formed in the P-type semiconductor layer 102 adjacent to the bottom surface and the side surfaces of the first and second gate insulation layers 112 and 114. Accordingly, no current path is formed between the first impurity diffusion region 152 and one end of the variable resistive material layer 120 as well as between the second impurity diffusion region 154 and the other end of the variable resistive material layer 120. When the word line voltage (e.g., a ground voltage) lower than the threshold voltage of the nonvolatile memory cell 100 having a MOS structure is applied to the word line WL, no one of the set operation, the reset operation and the read operation may be achieved even when a bias is applied between the source line SL and the bit line BL.

Figure 4:
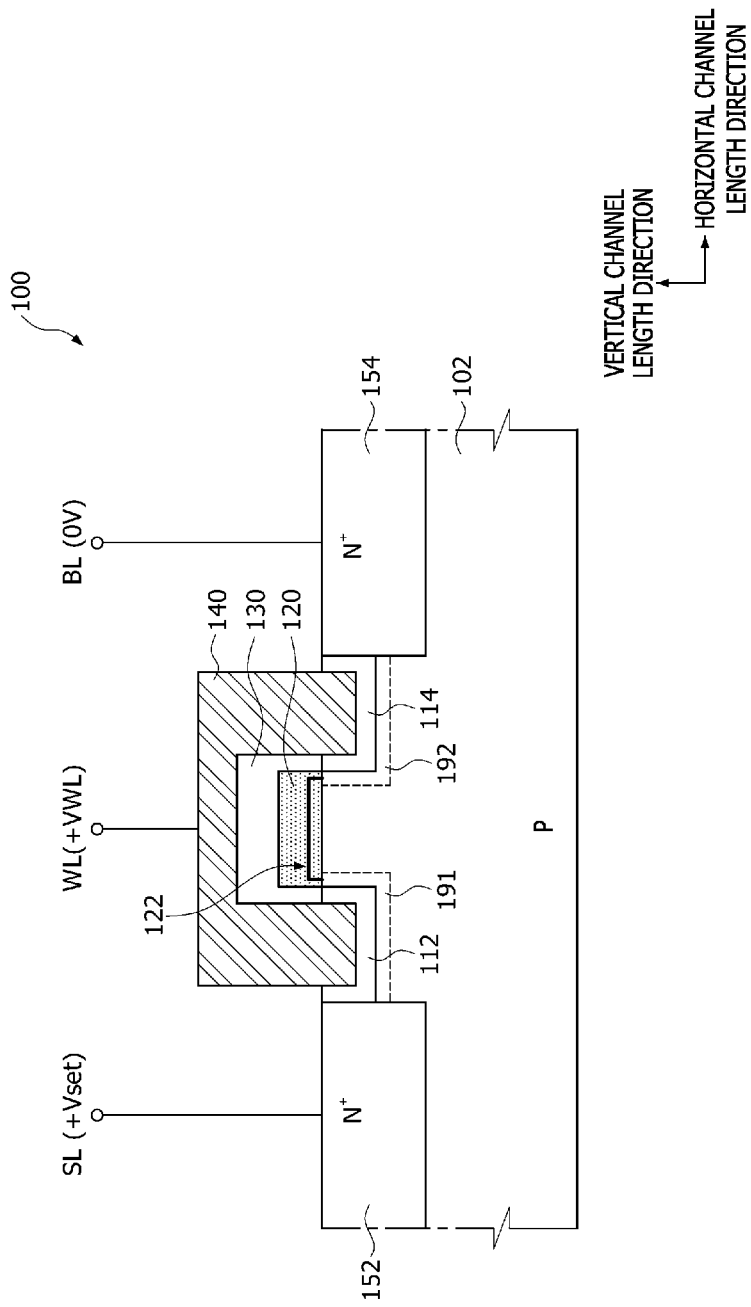
FIG. 4 is a cross-sectional view illustrating an example of a set operation of a nonvolatile memory cell according to an embodiment of the present disclosure.

FIG. 4 is a cross-sectional view illustrating an example of the set operation of the nonvolatile memory cell 100 shown in FIGS. 1 and 2. In FIG. 4, the same reference numerals and symbols as used in FIGS. 1 and 2 denote the same elements. A positive polarity of various voltages used in the following set operation is merely an example of suitable polarities. Accordingly, it may be apparent that only negative voltages or both positive and negative voltages may be used to perform the set operation according to various embodiments. As described with reference to FIG. 3, the nonvolatile memory cell 100 is selected by forming the first and second channels 191 and 192 to perform the set operation. In addition, the following set operation will be described for a case in which the variable resistive material layer 120 of the nonvolatile memory cell 100 comprises a resistive dielectric layer. Referring to FIG. 4, in order to selectively perform the set operation of the nonvolatile memory cell 100, a positive set voltage +Vset may be applied to the source line SL and the ground voltage 0V may be applied to the bit line BL. If voltage drops across all of the elements (e.g., the source line SL, the bit line BL, the first and second impurity diffusion regions 152 and 154, and the first and second channels 191 and 192) are neglected, the positive set voltage +Vset may be applied to one end of the variable resistive material layer 120 through the first impurity diffusion region 152 and the first channel 191 and the ground voltage 0V may be applied to the other end of the variable resistive material layer 120 through the second impurity diffusion region 154 and the second channel 192. In such a case, a lateral electric field may be created in the variable resistive material layer 120 due to a voltage pulse of the positive set voltage +Vset in the horizontal channel length direction, thereby forming a conductive filament 122 along the horizontal channel length direction. Accordingly, a resistive state of the variable resistive material layer 120 may be changed from a high resistive state into a low resistive state. In an embodiment, the low resistive state of the variable resistive material layer 120 may be defined as a binary number "0".

Figure 5:
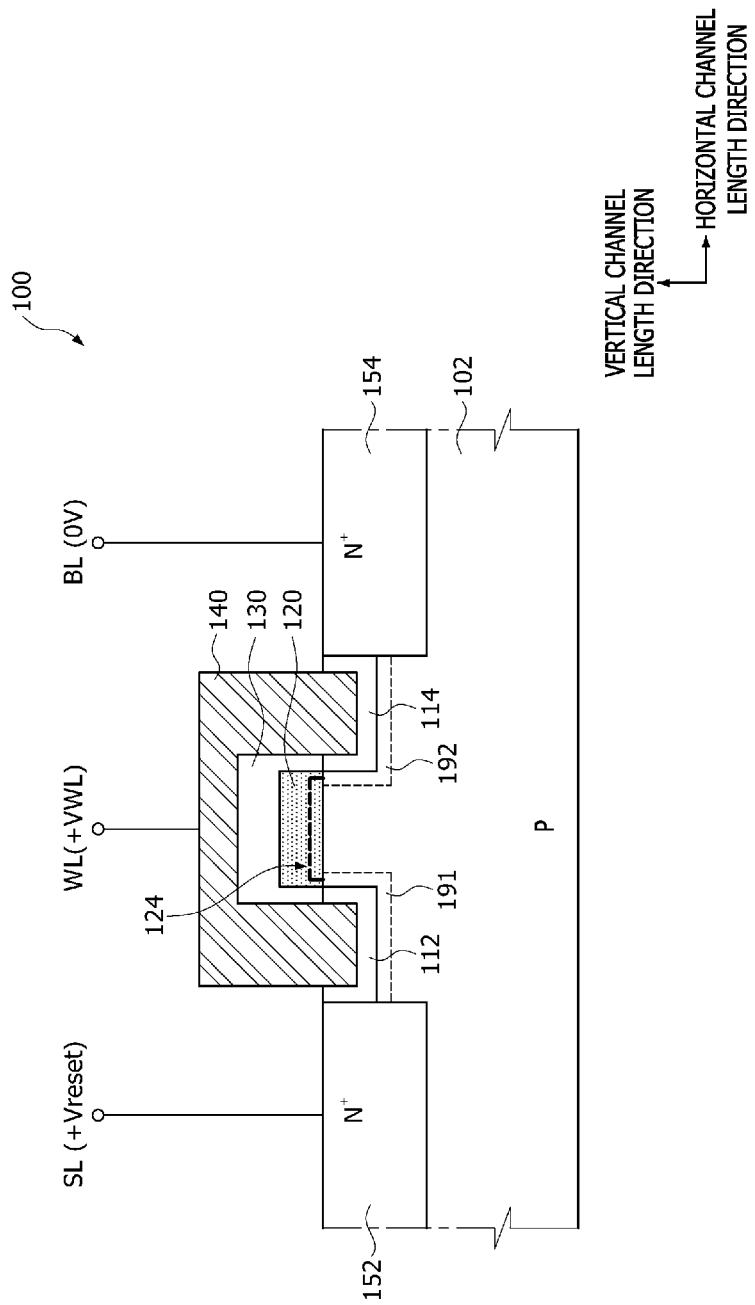
FIG. 5 is a cross-sectional view illustrating an example of a reset operation of a nonvolatile memory cell according to an embodiment of the present disclosure.

FIG. 5 is a cross-sectional view illustrating an example of the reset operation of the nonvolatile memory cell 100 shown in FIGS. 1 and 2. In FIG. 5, the same reference numerals and symbols as used in FIGS. 1 and 2 denote the same elements. A positive polarity of various voltages used in the following reset operation is merely an example of suitable polarities. Accordingly, it may be apparent that only negative voltages or both positive and negative voltages may also be used to perform the reset operation according to various embodiments. As described with reference to FIG. 3, the nonvolatile memory cell 100 is selected by forming the first and second channels 191 and 192 to perform the reset operation. In addition, the following reset operation will be described for a case in which the variable resistive material layer 120 of the nonvolatile memory cell 100 comprises a resistive dielectric layer. Referring to FIG. 5, in order to selectively perform the reset operation of the nonvolatile memory cell 100, a positive reset voltage +Vreset may be applied to the source line SL and the ground voltage 0V may be applied to the bit line BL. If voltage drops across all of the elements (e.g., the source line SL, the bit line BL, the first and second impurity diffusion regions 152 and 154, and the first and second channels 191 and 192) are neglected, the positive reset voltage +Vreset may be applied to one end of the variable resistive material layer 120 through the first impurity diffusion region 152 and the first channel 191, and the ground voltage 0V may be applied to the other end of the variable resistive material layer 120 through the second impurity diffusion region 154 and the second channel 192. In such a case, a lateral electric field may be created in the variable resistive material layer 120 due to a voltage pulse of the positive reset voltage +Vreset in the horizontal channel length direction, thereby forming a ruptured conductive filament 124 along the horizontal channel length direction. Accordingly, a resistive state of the variable resistive material layer 120 may be changed from a low resistive state into a high resistive state. In an embodiment, the high resistive state of the variable resistive material layer 120 may be defined as a binary number "1".

According to the examples described with reference to FIGS. 4 and 5, in order to perform the set operation or the reset operation, the positive set voltage +Vset or the positive reset voltage +Vreset may be applied to the source line SL and the ground voltage 0V may be applied to the bit line BL. However, the above bias condition is merely an example of various bias conditions for performing the set operation or the reset operation. That is, the opposite bias condition may also be applied to the nonvolatile memory cell 100 to perform the set operation or the reset operation. For example, the set operation or the reset operation may be performed by applying the positive set voltage +Vset or the positive reset voltage +Vreset to the bit line BL and applying the ground voltage to the source line SL. The resistive dielectric layer used as the variable resistive material layer 120 may have a bidirectional characteristic. Thus, the positive set voltage +Vset may be applied to the source line SL to perform the set operation, and the positive reset voltage +Vreset may be applied to the bit line BL to perform the reset operation. Similarly, the positive set voltage +Vset may be applied to the bit line BL to perform the set operation, and the positive reset voltage +Vreset may be applied to the source line SL to perform the reset operation.

Figure 6:
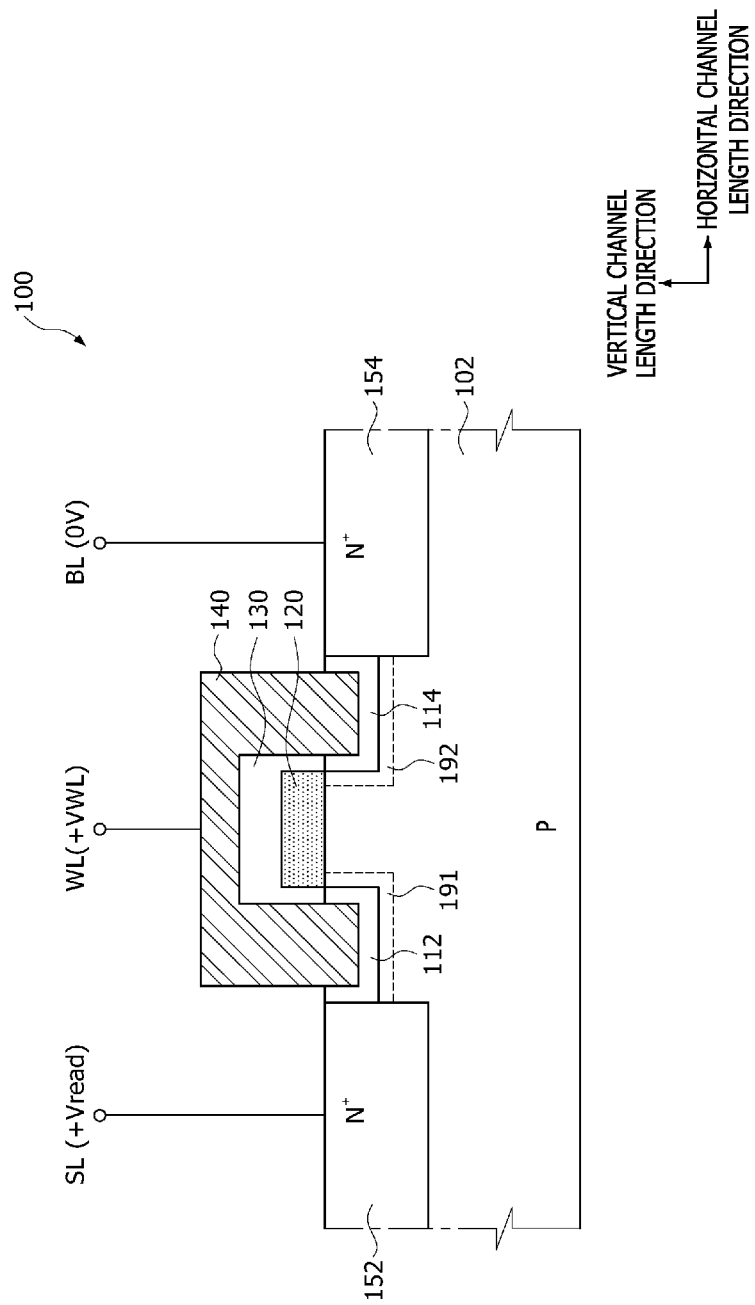
FIG. 6 is a cross-sectional view illustrating an example of a read operation of a nonvolatile memory cell according to an embodiment of the present disclosure.

FIG. 6 is a cross-sectional view illustrating an example of the read operation of the nonvolatile memory cell 100 shown in FIGS. 1 and 2. In FIG. 6, the same reference numerals and symbols as used in FIGS. 1 and 2 denote the same elements. A positive polarity of various voltages used in the following read operation is merely an example of suitable polarities. Accordingly, it may be apparent that only negative voltages or both positive and negative voltages may also be used to perform the read operation according to various embodiments. As described with reference to FIG. 3, the nonvolatile memory cell 100 is selected by forming the first and second channels 191 and 192 to perform the read operation. In addition, the following read operation will be described for a case in which the variable resistive material layer 120 of the nonvolatile memory cell 100 comprises a resistive dielectric layer. Referring to FIG. 6, in order to selectively perform the read operation of the nonvolatile memory cell 100, a positive read voltage +Vread may be applied to the source line SL and the ground voltage 0V may be applied to the bit line BL. In an embodiment, the positive read voltage +Vread may have a magnitude between the positive reset voltage +Vreset and the positive set voltage +Vset. If voltage drops across all of the elements (e.g., the source line SL, the bit line BL, the first and second impurity diffusion regions 152 and 154, and the first and second channels 191 and 192) are neglected, the positive read voltage +Vread may be applied to one end of the variable resistive material layer 120 through the first impurity diffusion region 152 and the first channel 191 and the ground voltage 0V may be applied to the other end of the variable resistive material layer 120 through the second impurity diffusion region 154 and the second channel 192. In such a case, because a lateral electric field is created in the variable resistive material layer 120 due to the positive read voltage +Vread applied between both ends of the variable resistive material layer 120 in the horizontal channel length direction, current may flow from the source line SL toward the bit line BL or no current may flow through the source line SL and the bit line BL, according to a resistive state of the variable resistive material layer 120.

When the variable resistive material layer 120 has a low resistive state as a result of the set operation, a current due to the positive read voltage +Vread may flow from the source line SL toward the bit line BL through the variable resistive material layer 120. In such a case, the current flowing through the bit line BL may be sensed by a sensing circuit coupled to the bit line BL, and the nonvolatile memory cell 100 may be regarded as having a binary number "0". When the variable resistive material layer 120 has a high resistive state as a result of the reset operation, no current may flow from the source line SL toward the bit line BL even though the positive read voltage +Vread is applied between both ends of the variable resistive material layer 120. Accordingly, no current may be sensed by the sensing circuit coupled to the bit line BL, and the nonvolatile memory cell 100 may be regarded as having a binary number "1".

Figure 7:
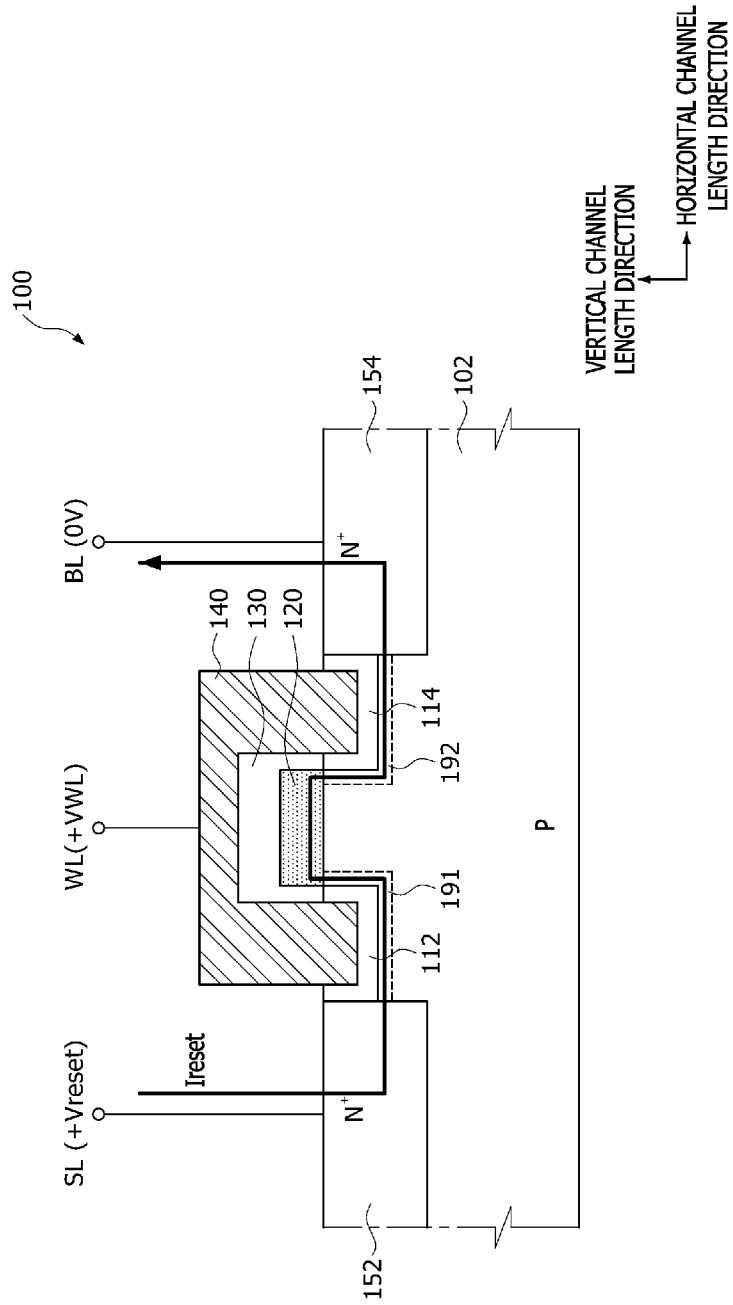
FIG. 7 is a cross-sectional view illustrating another example of a reset operation of a nonvolatile memory cell according to an embodiment of the present disclosure.

FIG. 7 is a cross-sectional view illustrating another example of the reset operation of the nonvolatile memory cell 100 shown in FIGS. 1 and 2. In FIG. 7, the same reference numerals and symbols as used in FIGS. 1 and 2 denote the same elements. A positive polarity of various voltages used in the following reset operation is merely an example of suitable polarities. Accordingly, it may be apparent that only negative voltages or both positive and negative voltages may also be used to perform the reset operation according to various embodiments. As described with reference to FIG. 3, the nonvolatile memory cell 100 is selected by forming the first and second channels 191 and 192 to perform the reset operation. In addition, the following reset operation will be described for a case in which the variable resistive material layer 120 of the nonvolatile memory cell 100 comprises a phase changeable material layer. Referring to FIG. 7, in order to selectively perform the reset operation of the nonvolatile memory cell 100, a positive reset voltage +Vreset having a pulse form with a relatively high magnitude and a relatively narrow width may be applied to the source line SL and the ground voltage 0V may be applied to the bit line BL. Because of the presence of the first and second channels 191 and 192 previously formed, a large reset current Ireset may flow from the source line SL toward the bit line BL through the first channel 191, the variable resistive material layer 120 and the second channel 192 when the positive reset voltage +Vreset is applied to the source line SL. In such a case, the variable resistive material layer 120 may be heated by the reset current Ireset to a temperature over a melting point thereof during a relatively short period to have a melted pool therein and may be cooled down rapidly to have an amorphous phase. The variable resistive material layer 120 having the amorphous phase may exhibit a high resistive state which is defined as a binary number "1".

Figure 8:
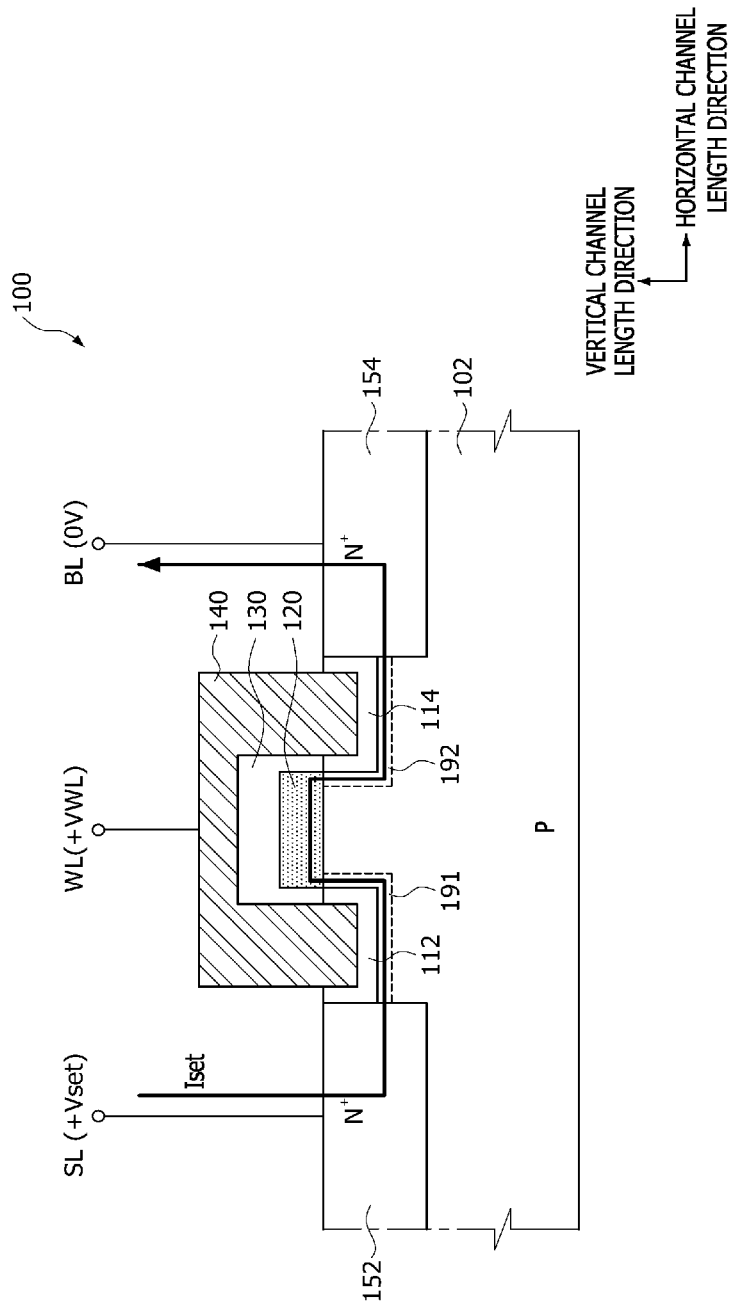
FIG. 8 is a cross-sectional view illustrating another example of a set operation of a nonvolatile memory cell according to an embodiment of the present disclosure.

FIG. 8 is a cross-sectional view illustrating another example of the set operation of the nonvolatile memory cell 100 shown in FIGS. 1 and 2. In FIG. 8, the same reference numerals and symbols as used in FIGS. 1 and 2 denote the same elements. A positive polarity of various voltages used in the following set operation is merely an example of suitable polarities. Accordingly, it may be apparent that only negative voltages or both positive and negative voltages may also be used to perform the set operation according to various embodiments. As described with reference to FIG. 3, the nonvolatile memory cell 100 is selected by forming the first and second channels 191 and 192 to perform the set operation. In addition, the following set operation will be described for a case in which the variable resistive material layer 120 of the nonvolatile memory cell 100 comprises a phase changeable material layer. Referring to FIG. 8, in order to selectively perform the set operation of the nonvolatile memory cell 100, a positive set voltage +Vset having a pulse form may be applied to the source line SL and the ground voltage 0V may be applied to the bit line BL. The positive set voltage +Vset may have a magnitude which is less than a magnitude of the positive reset voltage +Vreset illustrated in FIG. 7. Because of the presence of the first and second channels 191 and 192 previously formed, a set current Iset smaller than the reset current Ireset may flow from the source line SL toward the bit line BL through the first channel 191, the variable resistive material layer 120 and the second channel 192 when the positive set voltage +Vset is applied to the source line SL. In such a case, the variable resistive material layer 120 may be heated by the set current Iset to a temperature which is in the range of a crystallization temperature thereof to the melting point during a relatively long period to have a crystalline phase. The variable resistive material layer 120 having the crystalline phase may exhibit a low resistive state which is defined as a binary number "0".

Figure 9:
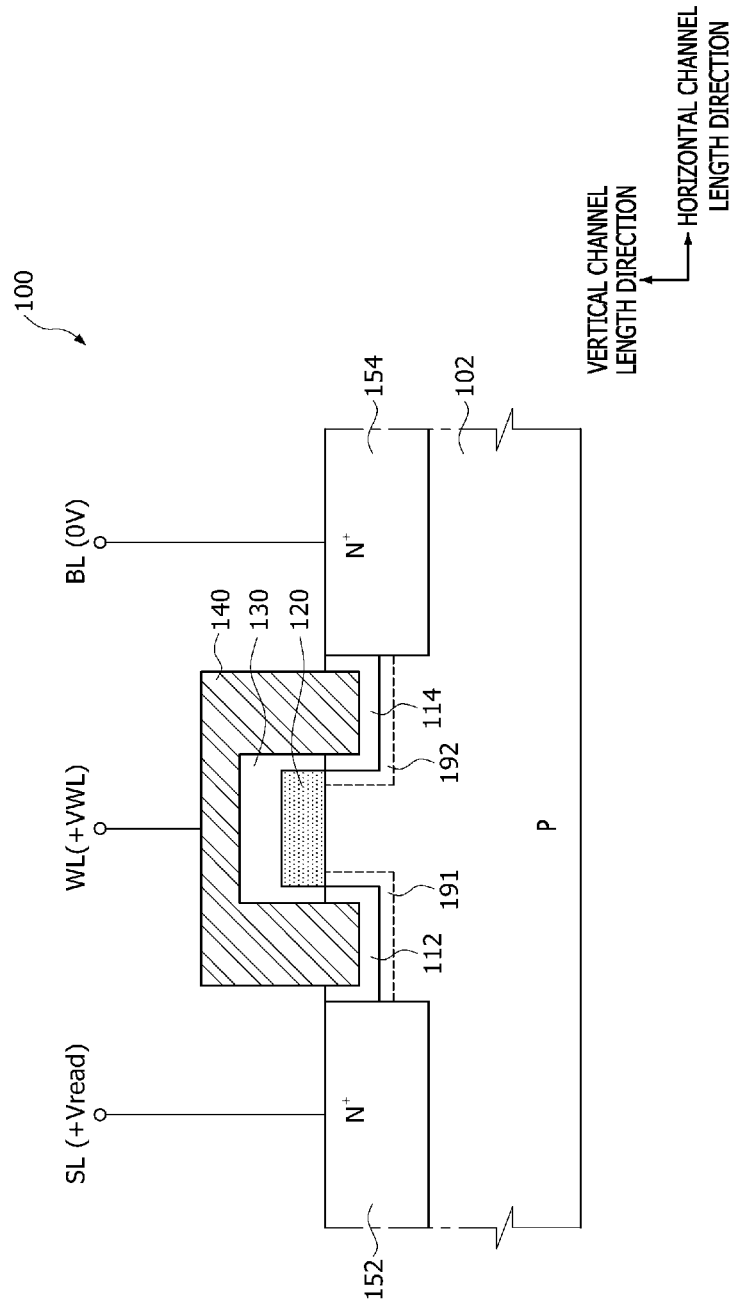
FIG. 9 is a cross-sectional view illustrating another example of a read operation of a nonvolatile memory cell according to an embodiment of the present disclosure.

FIG. 9 is a cross-sectional view illustrating another example of the read operation of the nonvolatile memory cell 100 shown in FIGS. 1 and 2. In FIG. 9, the same reference numerals and symbols as used in FIGS. 1 and 2 denote the same elements. A positive polarity of various voltages used in the following set operation is merely an example of suitable polarities. Accordingly, it may be apparent that only negative voltages or both positive and negative voltages may also be used to perform the set operation according to various embodiments. As described with reference to FIG. 3, the nonvolatile memory cell 100 is selected by forming the first and second channels 191 and 192 to perform the read operation. In addition, the following read operation will be described for a case in which the variable resistive material layer 120 of the nonvolatile memory cell 100 comprises a phase changeable material layer. Referring to FIG. 9, in order to selectively perform the read operation of the nonvolatile memory cell 100, a positive read voltage +Vread may be applied to the source line SL and the ground voltage 0V may be applied to the bit line BL. In an embodiment, the positive read voltage +Vread may have a magnitude between the positive reset voltage +Vreset and the positive set voltage +Vset. If voltage drops across all of the elements (e.g., the source line SL, the bit line BL, the first and second impurity diffusion regions 152 and 154, and the first and second channels 191 and 192) are neglected, the positive read voltage +Vread may be applied to one end of the variable resistive material layer 120 through the first impurity diffusion region 152 and the first channel 191, and the ground voltage 0V may be applied to the other end of the variable resistive material layer 120 through the second impurity diffusion region 154 and the second channel 192. In such a case, because a lateral electric field is created in the variable resistive material layer 120 due to the positive read voltage +Vread applied between both ends of the variable resistive material layer 120 in the horizontal channel length direction, current may flow from the source line SL toward the bit line BL or no current may flow through the source line SL and the bit line BL, according to a resistive state of the variable resistive material layer 120.

When the variable resistive material layer 120 has a crystalline phase (i.e., a low resistive state) as a result of the set operation, a current due to the positive read voltage +Vread may flow from the source line SL toward the bit line BL through the variable resistive material layer 120. In such a case, the current flowing through the bit line BL may be sensed by a sensing circuit coupled to the bit line BL, and the nonvolatile memory cell 100 may be regarded as having a binary number "0". When the variable resistive material layer 120 has an amorphous phase (i.e., a high resistive state) as a result of the reset operation, no current may flow from the source line SL toward the bit line BL even though the positive read voltage +Vread is applied between both ends of the variable resistive material layer 120. Accordingly, no current may be sensed by the sensing circuit coupled to the bit line BL, and the nonvolatile memory cell 100 may be regarded as having a binary number "1".

Figure 10:
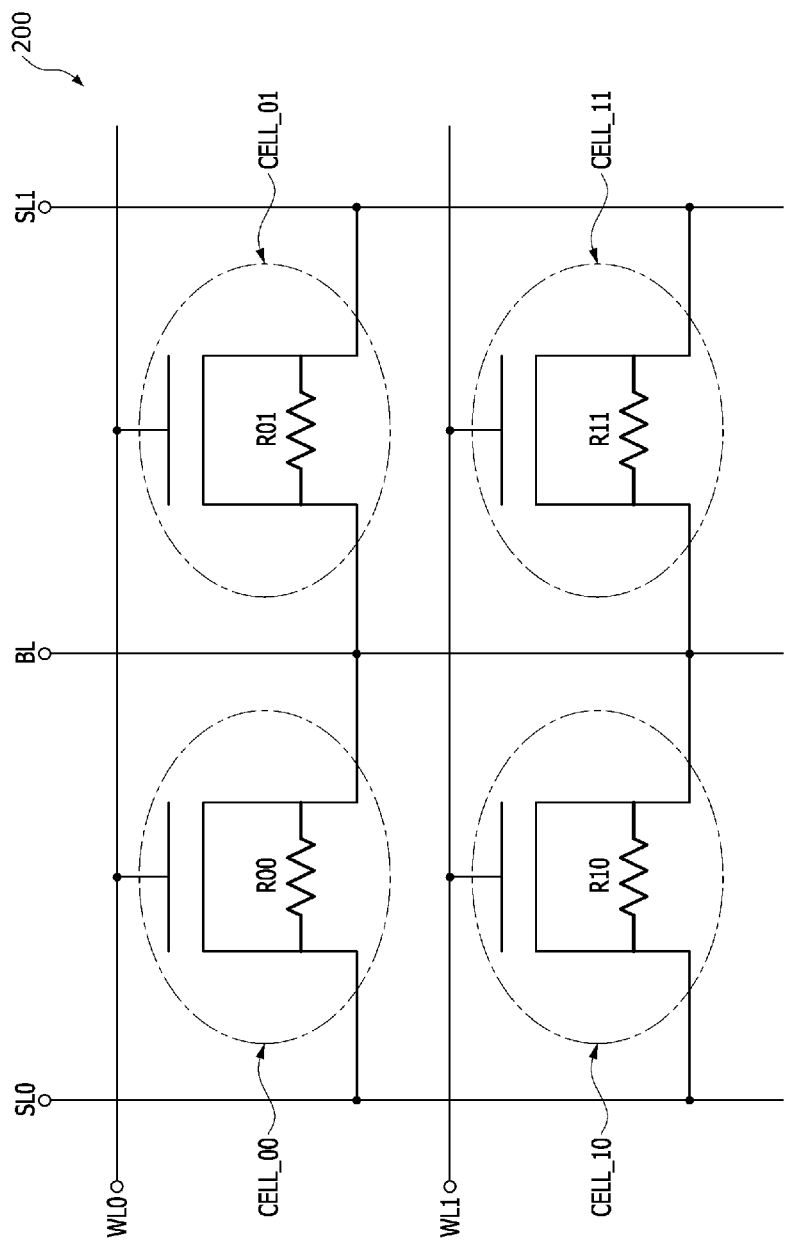
FIG. 10 is an equivalent circuit illustrating a nonvolatile memory cell array according to an embodiment of the present disclosure.

FIG. 10 is an equivalent circuit illustrating a nonvolatile memory cell array 200 according to an embodiment of the present disclosure. Referring to FIG. 10, the nonvolatile memory cell array 200 may include a plurality of unit cells, for example, first to fourth unit cells CELL_00, CELL_01, CELL_10 and CELL_11. Although FIG. 10 illustrates an example in which the nonvolatile memory cell array 200 includes four unit cells, the present disclosure is not limited thereto. That is, the number of the unit cells included in the nonvolatile memory cell array 200 may be set to be different according to various embodiments. Each of the first to fourth unit cells CELL_00, CELL_01, CELL_10 and CELL_11 may have the same configuration as the nonvolatile memory cell 100 described with reference to FIGS. 1 and 2. Thus, the first unit cell CELL_00 may include a first resistor R00 corresponding to the variable resistive material layer (120 of FIG. 1) disposed between first and second channel regions, and the second unit cell CELL_01 may include a second resistor R01 corresponding to the variable resistive material layer (120 of FIG. 1) disposed between first and second channel regions. Similarly, the third unit cell CELL_10 may include a third resistor R10 corresponding to the variable resistive material layer (120 of FIG. 1) disposed between first and second channel regions, and the fourth unit cell CELL_11 may include a fourth resistor R11 corresponding to the variable resistive material layer (120 of FIG. 1) disposed between first and second channel regions.

The first to fourth unit cells CELL_00, CELL_01, CELL_10 and CELL_11 may be arrayed in a matrix form along rows and columns. The nonvolatile memory cell array 200 may include a first word line WL0 and a second word line WL1 extending in a direction parallel with the rows. The first word line WL0 and the second word line WL1 may be spaced apart from each other in a direction parallel with the columns. The nonvolatile memory cell array 200 may also include a first source line SL0, a second source line SL1 and a bit line BL which extend in a direction parallel with the columns. The first source line SL0, the second source line SL1 and the bit line BL may be spaced apart from each other in a direction parallel with the rows. As described with reference to FIG. 2, the first and second word lines WL0 and WL1 may be coupled to the gate terminals of the unit cells and the first and second source lines SL0 and SL1 may be coupled to the source terminals of the unit cells. In addition, the bit line BL may be coupled to the drain terminals of the unit cells.

The first and second unit cells CELL_00 and CELL_01 arrayed in a first row may share the first word line WL0 with each other. Similarly, the third and fourth unit cells CELL_10 and CELL_11 arrayed in a second row may share the second word line WL1 with each other. The first and third unit cells CELL_00 and CELL_10 arrayed in a first column may share the first source line SL0 with each other. Similarly, the second and fourth unit cells CELL_01 and CELL_11 arrayed in a second column may share the second source line SL1 with each other. In an embodiment, if "i" is an odd number, the unit cells arrayed in an $i^{th}$ column may share one bit line with the unit cells arrayed in an $(i+1)^{th}$ column. For example, the first and third unit cells CELL_00 and CELL_10 arrayed in the first column may share the bit line BL with the second and fourth unit cells CELL_01 and CELL_11 arrayed in the second column.

Figure 11:
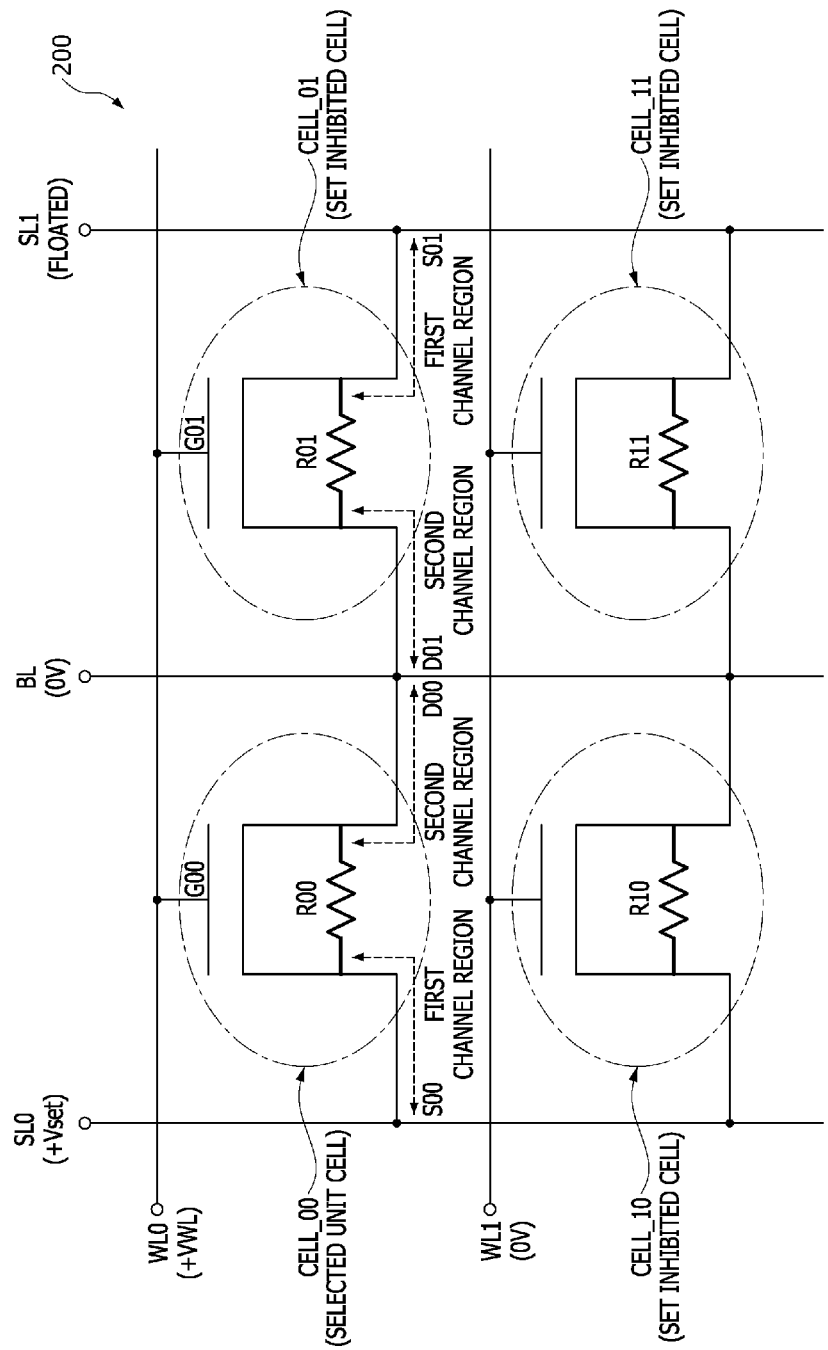
FIG. 11 is an equivalent circuit illustrating an example of a set operation of a selected unit cell in a nonvolatile memory cell array according to an embodiment of the present disclosure.

FIG. 11 is an equivalent circuit illustrating an example of the set operation for one unit cell selected from the first to fourth unit cells CELL_00, CELL_01, CELL_10 and CELL_11 included in the nonvolatile memory cell array 200 shown in FIG. 10. The following set operation will be described for a case in which the first unit cell CELL_00 is selected. A positive polarity of various voltages used in the following set operation is merely an example of suitable polarities. Accordingly, it may be apparent that only negative voltages or both positive and negative voltages may also be used to perform the set operation according to various embodiments. Referring to FIG. 11, the positive word line voltage +VWL may be applied to the first word line WL0 coupled to the selected unit cell CELL_00, and the ground voltage (0V) may be applied to the remaining word line, that is, the second word line WL1. In addition, the positive set voltage +Vset and the ground voltage (0V) may be applied to the first source line SL0 and the bit line BL which are coupled to the selected unit cell CELL_00, respectively. Furthermore, the remaining source line, that is, the second source line SL1 may be electrically floated.

In case of the selected unit cell CELL_00, the positive word line voltage +VWL may be transferred to gate terminal G00 of the selected unit cell CELL_00 through the first word line WL0. Thus, as described with reference to FIG. 3, the first channel may be formed between the first resistor R00 and a source terminal S00 of the selected unit cell CELL_00, and the second channel may be formed between the first resistor R00 and a drain terminal D00 of the selected unit cell CELL_00. In addition, because the positive set voltage +Vset and the ground voltage (0V) are applied to respective ones of the first source line SL0 and the bit line BL, the first resistor R00 may be transformed to have a low resistive state corresponding to a binary number "0" as described with reference to FIGS. 4 and 8. That is, as described with reference to FIG. 4, a conductive filament may be formed in the first resistor R00 under the above bias condition such that the first resistor R00 has a low resistive state when the first resistor R00 comprises a resistive dielectric layer. Alternatively, as described with reference to FIG. 8, the first resistor R00 may be transformed to have a crystalline phase corresponding to a low resistive state under the above bias condition when the first resistor R00 comprises a phase changeable material layer.

In case of the second unit cell CELL_01 sharing the first word line WL0 with the selected unit cell CELL_00, the positive word line voltage +VWL may be transferred to a gate terminal G01 of the second unit cell CELL_01 through the first word line WL0. Thus, as described with reference to FIG. 3, the first channel may be formed between the second resistor R01 and a source terminal S01 of the second unit cell CELL_01, and the second channel may be formed between the second resistor R01 and a drain terminal D01 of the second unit cell CELL_01. However, because the second source line SL1 coupled to the source terminal S01 of the second unit cell CELL_01 is electrically floated, no voltage pulse is applied between both ends of the second resistor R01. As a result, no current flows through the second resistor R01. Thus, the second unit cell CELL_01 may become a set inhibited cell. In case of the third and fourth unit cells CELL_10 and CELL_11 coupled to the remaining word line (i.e., the second word line WL1), none of the first and second channels are formed in each of the third and fourth unit cells CELL_10 and CELL_11 under the above bias condition. Thus, the set operation is not performed in the third and fourth unit cells CELL_10 and CELL_11. That is, the third and fourth unit cells CELL_10 and CELL_11 may also become set inhibited cells.

Figure 12:
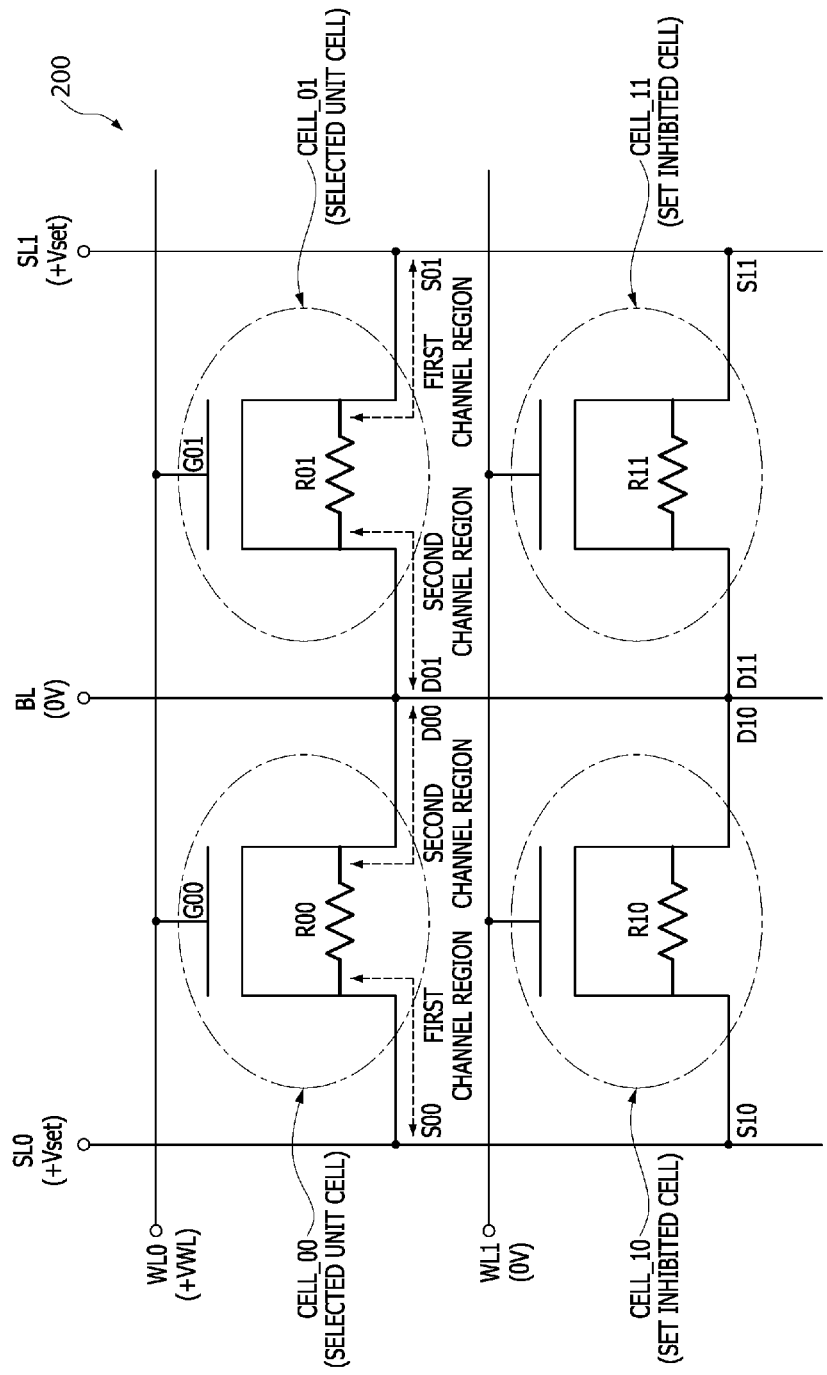
FIG. 12 is an equivalent circuit illustrating an example of a set operation of a plurality of selected unit cells in a nonvolatile memory cell array according to an embodiment of the present disclosure.

FIG. 12 is an equivalent circuit illustrating an example of the set operation for a plurality of unit cells selected from the first to fourth unit cells CELL_00, CELL_01, CELL_10 and CELL_11 included in the nonvolatile memory cell array 200 shown in FIG. 10. The following set operation will be described for a case in which the first and second unit cells CELL_00 and CELL_01 sharing the first word line WL0 are selected. A positive polarity of various voltages used in the following set operation is merely an example of suitable polarities. Accordingly, it may be apparent that only negative voltages or both positive and negative voltages may also be used to perform the set operation according to various embodiments. Referring to FIG. 12, the positive word line voltage +VWL may be applied to the first word line WL0 coupled to the selected unit cells CELL_00 and CELL_01, and the ground voltage (0V) may be applied to the remaining word line, that is, the second word line WL1. In addition, the positive set voltage +Vset may be applied to the first and second source lines SL0 and SL1 coupled to the selected unit cells CELL_00 and CELL_01, and the ground voltage (0V) may be applied to the bit line BL that the selected unit cells CELL_00 and CELL_01 share.

In case of the selected first unit cell CELL_00, the positive word line voltage +VWL may be transferred to the gate terminal G00 of the selected first unit cell CELL_00 through the first word line WL0. Thus, as described with reference to FIG. 3, the first channel may be formed between the first resistor R00 and the source terminal S00 of the selected first unit cell CELL_00, and the second channel may be formed between the first resistor R00 and the drain terminal D00 of the selected first unit cell CELL_00. Similarly, even in case of the selected second unit cell CELL_01, the positive word line voltage +VWL may be transferred to the gate terminal G01 of the selected second unit cell CELL_01 through the first word line WL0. Thus, as described with reference to FIG. 3, the first channel may be formed between the second resistor R01 and the source terminal S01 of the selected second unit cell CELL_01, and the second channel may be formed between the second resistor R01 and the drain terminal D01 of the selected second unit cell CELL_01.

Under the above bias condition, because the positive set voltage +Vset is applied to the first and second source lines SL0 and SL1, and the ground voltage (0V) is applied to the bit line BL, the first and second resistors R00 and R01 may be transformed to have a low resistive state corresponding to a binary number "0" as described with reference to FIGS. 4 and 8. That is, as described with reference to FIG. 4, a conductive filament may be formed in each of the first and second resistors R00 and R01 under the above bias condition such that the first and second resistors R00 and R01 have a low resistive state when the first and second resistors R00 and R01 are comprised of a resistive dielectric layer. Alternatively, as described with reference to FIG. 8, the first and second resistors R00 and R01 may be transformed to have a crystalline phase corresponding to a low resistive state under the above bias condition when the first and second resistors R00 and R01 are comprised of a phase changeable material layer.

In case of the third and fourth unit cells CELL_10 and CELL_11 coupled to the remaining word line (i.e., the second word line WL1), none of the first and second channels are formed in each of the third and fourth unit cells CELL_10 and CELL_11 under the above bias condition. Thus, even though the positive set voltage +Vset is applied to the first source line SL0 coupled to the third unit cell CELL_10 and the ground voltage (0V) is applied to the bit line BL coupled to the third unit cell CELL_10, the set operation is not performed in the third unit cell CELL_10 because no channel is formed between the third resistor R10 and a source terminal S10 of the third unit cell CELL_10 as well as between the third resistor R10 and a drain terminal D10 of the third unit cell CELL_10. That is, the third unit cell CELL_10 may become set inhibited cell. Similarly, even though the positive set voltage +Vset is applied to the second source line SL1 coupled to the fourth unit cell CELL_11 and the ground voltage (0V) is applied to the bit line BL coupled to the fourth unit cell CELL_11, the set operation is not performed in the fourth unit cell CELL_11 because no channel is formed between the fourth resistor R11 and a source terminal S11 of the fourth unit cell CELL_11 as well as between the fourth resistor R11 and a drain terminal D11 of the fourth unit cell CELL_11. That is, the fourth unit cell CELL_11 may also become a set inhibited cell.

Figure 13:
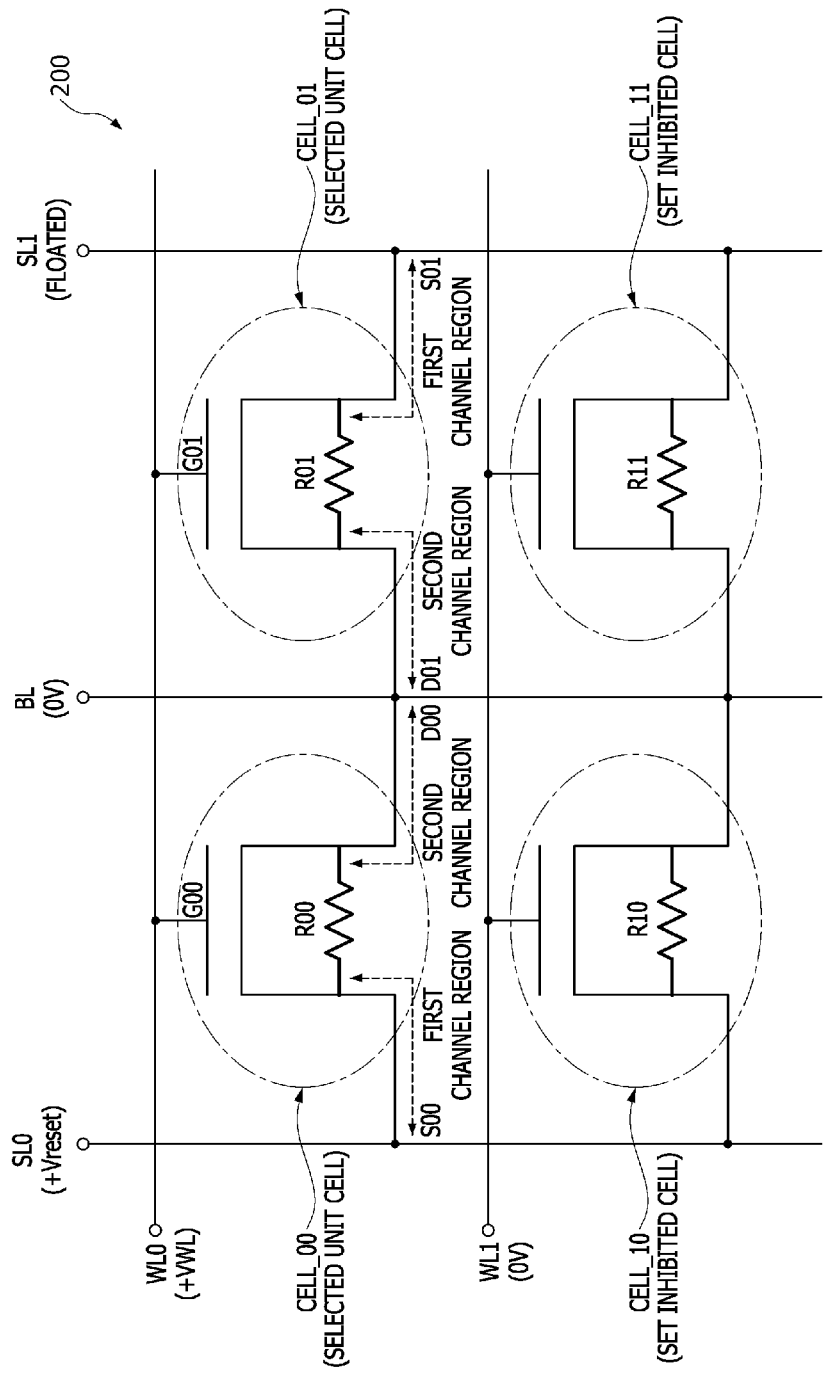
FIG. 13 is an equivalent circuit illustrating an example of a reset operation of a selected unit cell in a nonvolatile memory cell array according to an embodiment of the present disclosure.

FIG. 13 is an equivalent circuit illustrating an example of the reset operation for one unit cell selected from the first to fourth unit cells CELL_00, CELL_01, CELL_10 and CELL_11 included in the nonvolatile memory cell array 200 shown in FIG. 10. The following reset operation will be described for a case in which the first unit cell CELL_00 is selected. A positive polarity of various voltages used in the following reset operation is merely an example of suitable polarities. Accordingly, it may be apparent that only negative voltages or both positive and negative voltages may also be used to perform the reset operation according to various embodiments. Referring to FIG. 13, the positive word line voltage +VWL may be applied to the first word line WL0 coupled to the selected unit cell CELL_00, and the ground voltage (0V) may be applied to the remaining word line, that is, the second word line WL1. In addition, the positive reset voltage +Vreset and the ground voltage (0V) may be applied to the first source line SL0 and the bit line BL which are coupled to the selected unit cell CELL_00, respectively. Furthermore, the remaining source line, that is, the second source line SL1 may be electrically floated.

In case of the selected unit cell CELL_00, the positive word line voltage +VWL may be transferred to the gate terminal G00 of the selected unit cell CELL_00 through the first word line WL0. Thus, as described with reference to FIG. 3, the first channel may be formed between the first resistor R00 and the source terminal S00 of the selected unit cell CELL_00, and the second channel may be formed between the first resistor R00 and the drain terminal D00 of the selected unit cell CELL_00. In addition, because the positive reset voltage +Vreset and the ground voltage (0V) are applied to respective ones of the first source line SL0 and the bit line BL, the first resistor R00 may be transformed to have a high resistive state corresponding to a binary number "1" as described with reference to FIGS. 5 and 7. That is, as described with reference to FIG. 5, a conductive filament in the first resistor R00 may be ruptured under the above bias condition such that the first resistor R00 has a high resistive state when the first resistor R00 comprises a resistive dielectric layer. Alternatively, as described with reference to FIG. 7, the first resistor R00 may be transformed to have an amorphous phase corresponding to a high resistive state under the above bias condition when the first resistor R00 comprises a phase changeable material layer.

In case of the second unit cell CELL_01 sharing the first word line WL0 with the selected unit cell CELL_00, the positive word line voltage +VWL may be transferred to the gate terminal G01 of the second unit cell CELL_01 through the first word line WL0. Thus, as described with reference to FIG. 3, the first channel may be formed between the second resistor R01 and the source terminal S01 of the second unit cell CELL_01, and the second channel may be formed between the second resistor R01 and the drain terminal D01 of the second unit cell CELL_01. However, because the second source line SL1 coupled to the source terminal S01 of the second unit cell CELL_01 is electrically floated, no voltage pulse is applied between both ends of the second resistor R01. As a result, no current flows through the second resistor R01. Thus, the second unit cell CELL_01 may become a reset inhibited cell. In case of the third and fourth unit cells CELL_10 and CELL_11 coupled to the remaining word line (i.e., the second word line WL1), none of the first and second channels are formed in each of the third and fourth unit cells CELL_10 and CELL_11 under the above bias condition. Thus, the set operation is not performed in the third and fourth unit cells CELL_10 and CELL_11. That is, the third and fourth unit cells CELL_10 and CELL_11 may also become the reset inhibited cells.

Figure 14:
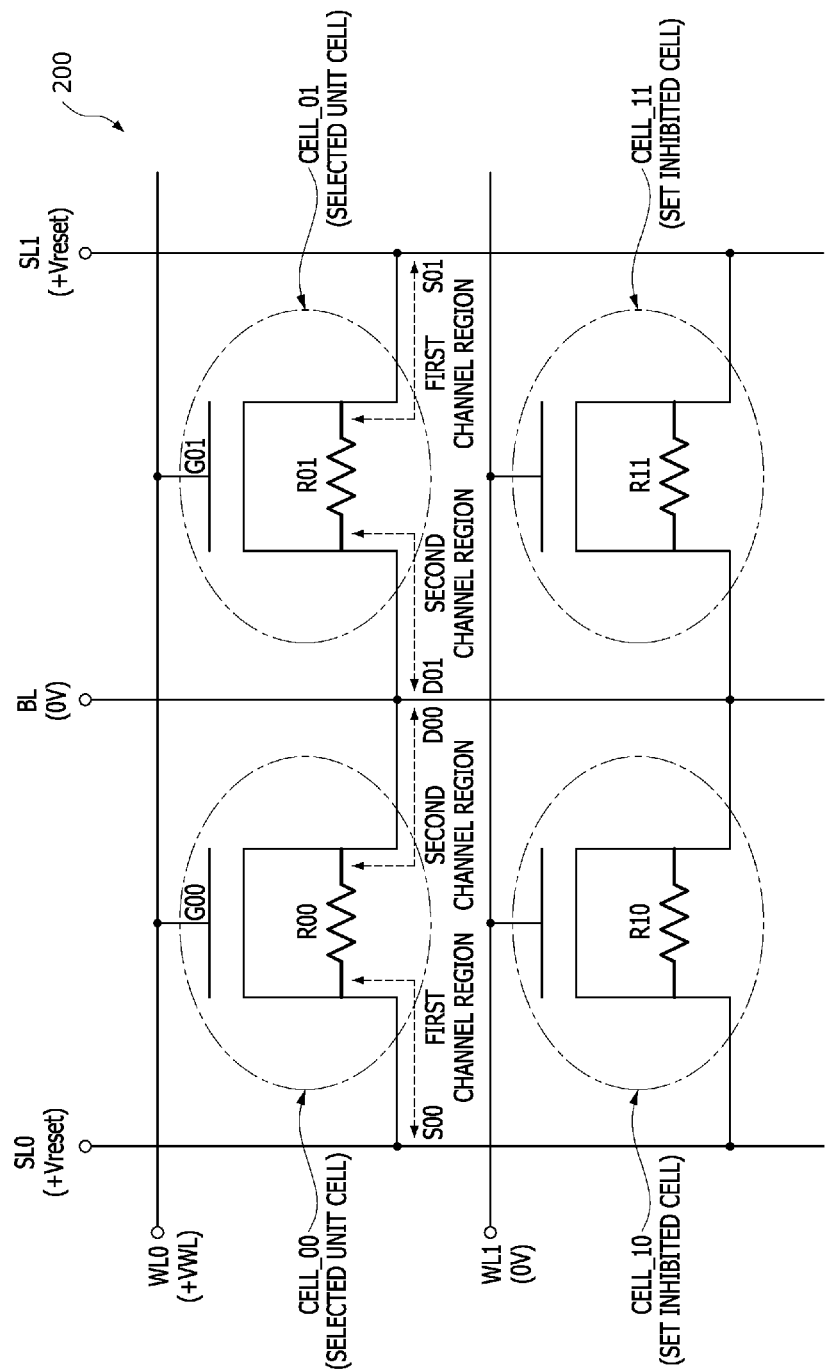
FIG. 14 is an equivalent circuit illustrating an example of a reset operation of a plurality of selected unit cells in a nonvolatile memory cell array according to an embodiment of the present disclosure.

FIG. 14 is an equivalent circuit illustrating an example of the reset operation for a plurality of unit cells selected from the first to fourth unit cells CELL_00, CELL_01, CELL_10 and CELL_11 included in the nonvolatile memory cell array 200 shown in FIG. 10. The following reset operation will be described for a case in which the first and second unit cells CELL_00 and CELL_01 sharing the first word line WL0 are selected. A positive polarity of various voltages used in the following reset operation is merely an example of suitable polarities. Accordingly, it may be apparent that only negative voltages or both positive and negative voltages may also be used to perform the reset operation according to various embodiments. Referring to FIG. 14, the positive word line voltage +VWL may be applied to the first word line WL0 coupled to the selected unit cells CELL_00 and CELL_01, and the ground voltage (0V) may be applied to the remaining word line, that is, the second word line WL1. In addition, the positive reset voltage +Vreset may be applied to the first and second source lines SL0 and SL1 coupled to the selected unit cells CELL_00 and CELL_01, and the ground voltage (0V) may be applied to the bit line BL that the selected unit cells CELL_00 and CELL_01 share.

In case of the selected first unit cell CELL_00, the positive word line voltage +VWL may be transferred to the gate terminal G00 of the selected first unit cell CELL_00 through the first word line WL0. Thus, as described with reference to FIG. 3, the first channel may be formed between the first resistor R00 and the source terminal S00 of the selected first unit cell CELL_00, and the second channel may be formed between the first resistor R00 and the drain terminal D00 of the selected first unit cell CELL_00. Similarly, even in case of the selected second unit cell CELL_01, the positive word line voltage +VWL may be transferred to the gate terminal G01 of the selected second unit cell CELL_01 through the first word line WL0. Thus, as described with reference to FIG. 3, the first channel may be formed between the second resistor R01 and the source terminal S01 of the selected second unit cell CELL_01, and the second channel may be formed between the second resistor R01 and the drain terminal D01 of the selected second unit cell CELL_01.

Under the above bias condition, because the positive reset voltage +Vreset is applied to the first and second source lines SL0 and SL1 and the ground voltage (0V) is applied to the bit line BL, the first and second resistors R00 and R01 may be transformed to have a high resistive state corresponding to a binary number "1" as described with reference to FIGS. 5 and 7. That is, as described with reference to FIG. 5, a conductive filament in each of the first and second resistors R00 and R01 may be ruptured under the above bias condition such that the first and second resistors R00 and R01 have a high resistive state when the first and second resistors R00 and R01 are comprised of a resistive dielectric layer. Alternatively, as described with reference to FIG. 7, the first and second resistors R00 and R01 may be transformed to have an amorphous phase corresponding to a high resistive state under the above bias condition when the first and second resistors R00 and R01 are comprised of a phase changeable material layer.

In case of the third and fourth unit cells CELL_10 and CELL_11 coupled to the remaining word line (i.e., the second word line WL1), none of the first and second channels are formed in each of the third and fourth unit cells CELL_10 and CELL_11 under the above bias condition. Thus, even though the positive reset voltage +Vreset is applied to the first source line SL0 coupled to the third unit cell CELL_10 and the ground voltage (0V) is applied to the bit line BL coupled to the third unit cell CELL_10, the set operation is not performed in the third unit cell CELL_10 because no channel is formed between the third resistor R10 and the source terminal S10 of the third unit cell CELL_10 as well as between the third resistor R10 and the drain terminal D10 of the third unit cell CELL_10. That is, the third unit cell CELL_10 may become the reset inhibited cell. Similarly, even though the positive reset voltage +Vreset is applied to the second source line SL1 coupled to the fourth unit cell CELL_11 and the ground voltage (0V) is applied to the bit line BL coupled to the fourth unit cell CELL_11, the set operation is not performed in the fourth unit cell CELL_11 because no channel is formed between the fourth resistor R11 and the source terminal S11 of the fourth unit cell CELL_11 as well as between the fourth resistor R11 and the drain terminal D11 of the fourth unit cell CELL_11. That is, the fourth unit cell CELL_11 may also become the reset inhibited cell.

Figure 15:
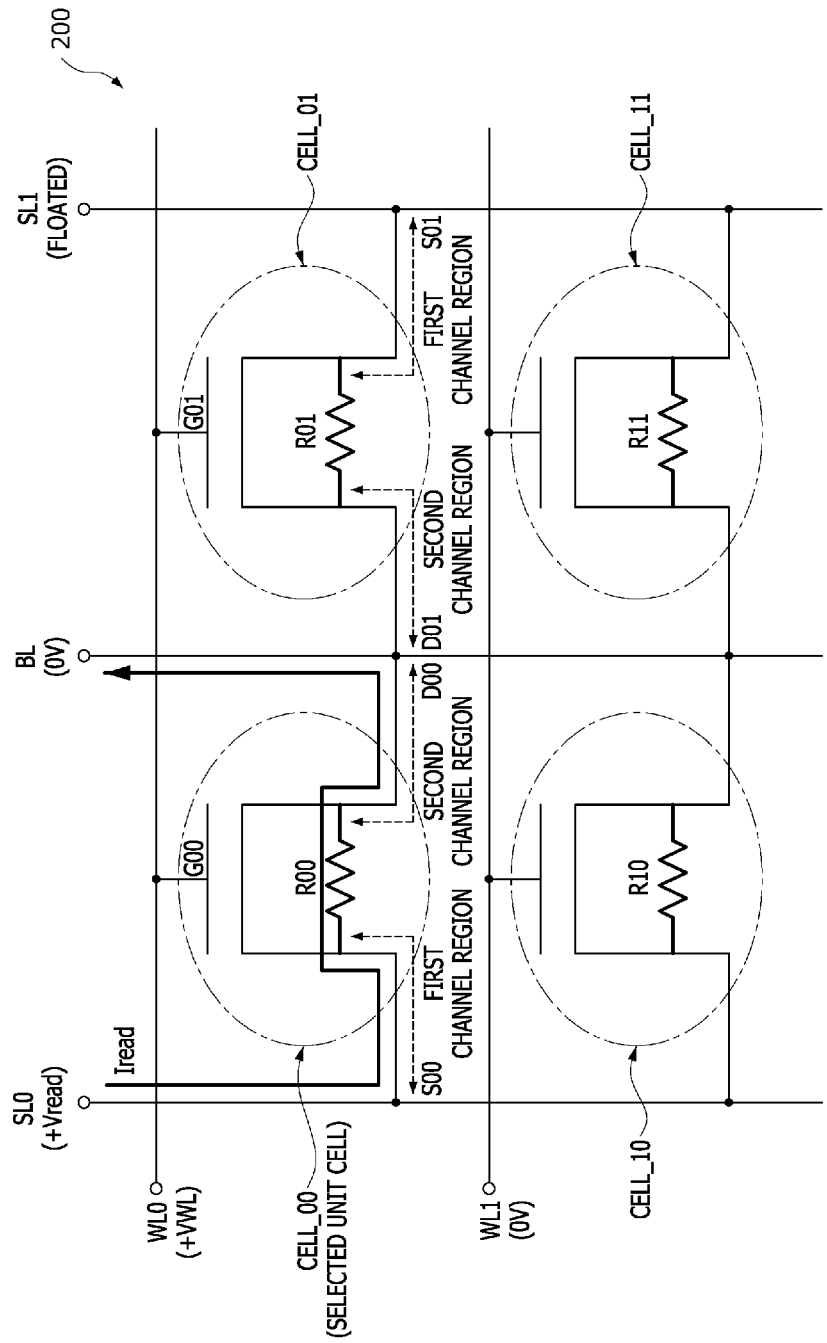
FIG. 15 is an equivalent circuit illustrating an example of a read operation of a selected unit cell in a nonvolatile memory cell array according to an embodiment of the present disclosure.

FIG. 15 is an equivalent circuit illustrating an example of the read operation for one unit cell selected from the first to fourth unit cells CELL_00, CELL_01, CELL_10 and CELL_11 included in the nonvolatile memory cell array 200 shown in FIG. 10. The following read operation will be described for a case in which the first unit cell CELL_00 is selected. A positive polarity of various voltages used in the following read operation is merely an example of suitable polarities. Accordingly, it may be apparent that only negative voltages or both positive and negative voltages may also be used to perform the read operation according to various embodiments. Referring to FIG. 15, the positive word line voltage +VWL may be applied to the first word line WL0 coupled to the selected unit cell CELL_00, and the ground voltage (0V) may be applied to the remaining word line, that is, the second word line WL1. In addition, the positive read voltage +Vread and the ground voltage (0V) may be applied to the first source line SL0 and the bit line BL which are coupled to the selected unit cell CELL_00, respectively.

Furthermore, the remaining source line, that is, the second source line SL1 may be electrically floated.

In case of the selected unit cell CELL_00, the positive word line voltage +VWL may be transferred to the gate terminal G00 of the selected unit cell CELL_00 through the first word line WL0. Thus, as described with reference to FIG. 3, the first channel may be formed between the first resistor R00 and the source terminal S00 of the selected unit cell CELL_00, and the second channel may be formed between the first resistor R00 and the drain terminal D00 of the selected unit cell CELL_00. In addition, because the positive read voltage +Vread and the ground voltage (0V) are applied to respective ones of the first source line SL0 and the bit line BL, current may flow from the first source line SL0 toward the bit line BL or no current may flow through the source line SL and the bit line BL according to a resistive state of the first resistor R00, as described with reference to FIGS. 6 and 9.

When the first resistor R00 has a low resistive state, a read current Iread may flow from the first source line SL0 toward the bit line BL through the first channel, the first resistor R00 and the second channel. In such a case, the read current Iread may be sensed by a sensing circuit coupled to the bit line BL, and the selected unit cell CELL_00 may be regarded as having a binary number "0". Although not shown in the drawings, when the first resistor R00 has a high resistive state, no current may flow from the first source line SL0 toward the bit line BL. In such a case, no current may be sensed by the sensing circuit coupled to the bit line BL, and the selected unit cell CELL_00 may be regarded as having a binary number "1".

In case of the second unit cell CELL_01 sharing the first word line WL0 with the selected unit cell CELL_00, the positive word line voltage +VWL may be transferred to the gate terminal G01 of the second unit cell CELL_01 through the first word line WL0. Thus, as described with reference to FIG. 3, the first channel may be formed between the second resistor R01 and the source terminal S01 of the second unit cell CELL_01, and the second channel may be formed between the second resistor R01 and the drain terminal D01 of the second unit cell CELL_01. However, because the second source line SL1 coupled to the source terminal S01 of the second unit cell CELL_01 is electrically floated, no voltage pulse is applied between both ends of the second resistor R01. As a result, no current flows through the second resistor R01. Thus, no read operation is performed in the second unit cell CELL_01. In case of the third and fourth unit cells CELL_10 and CELL_11 coupled to the remaining word line (i.e., the second word line WL1), none of the first and second channels are formed in each of the third and fourth unit cells CELL_10 and CELL_11 under the above bias condition. Thus, the read operation is not performed in the third and fourth unit cells CELL_10 and CELL_11.

Figure 16:
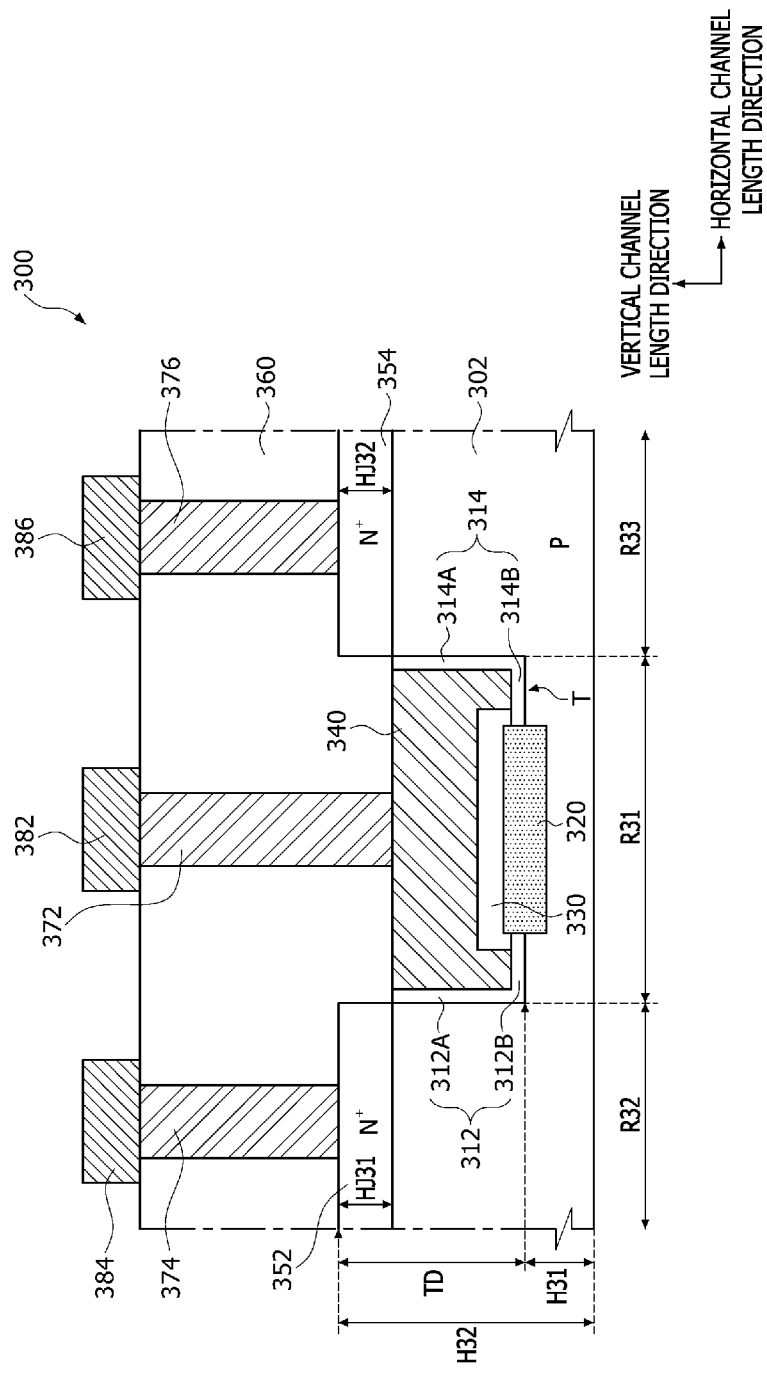
FIG. 16 is a cross-sectional view illustrating a nonvolatile memory cell according to another embodiment of the present disclosure.

FIG. 16 is a cross-sectional view illustrating a nonvolatile memory cell 300 according to another embodiment of the present disclosure. Referring to FIG. 16, the nonvolatile memory cell 300 may include a semiconductor layer 302. In an embodiment, the semiconductor layer 302 may correspond to a semiconductor substrate, but is not limited thereto. For example, in some other embodiments, the semiconductor layer 302 may be a well region disposed in an upper portion of the semiconductor substrate or an epitaxial layer disposed on the upper portion of the semiconductor substrate. The semiconductor layer 302 may have a first type conductivity, for example, a P-type conductivity. In an embodiment, the semiconductor layer 302 may be made of or include a silicon layer or a germanium layer. Alternatively, the semiconductor layer 302 may include a Group III-V compound layer such as a gallium nitride (GaN) layer. The semiconductor layer 302 may include a first region R31, a second region R32 and a third region R33 which are distinguished from each other along a horizontal channel length direction (i.e., a horizontal direction in FIG. 16). The second and third regions R32 and R33 may be disposed to be symmetrical to each other with respect to the first region R31 located at a central portion of the first to third regions R1~R3. The first and second regions R31 and R32 may be in contact with each other in the horizontal channel length direction, and the first and third regions R31 and R33 may also be in contact with each other in the horizontal channel length direction.

A trench T having a certain depth may be disposed in the first region R31 of the semiconductor layer 302. The trench T may have a trench depth TD. Accordingly, the second and third regions R32 and R33 of the semiconductor layer 302 may relatively and upwardly protrude to a level above the bottom surface of the trench T located in the first region R31 of the semiconductor layer 302. In the first region R31, the bottom surface of the trench T may correspond to a top surface of the semiconductor layer 302. In the first region R31 including the trench T, the semiconductor layer 302 may have a first surface height H31. In the second and third regions R32 and R33, the semiconductor layer 302 may have a second surface height H32. The first surface height H31 is the distance between the bottom surface and the top surface of the semiconductor layer 302 in the second and third regions R32 and R33. The second surface height H32 is the distance between the bottom surface and the top surface of the semiconductor layer 302 in the first region R31. The bottom surfaces of the first to third regions R31, R32 and R33 may be located at the same horizontal level corresponding to a bottom surface of the semiconductor layer 302. The second surface height H32 of the second and third regions R32 and R33 may be greater than the first surface height H31 of the first region R31 by the trench depth TD. In the first to third regions R31, R32 and R33, a top surface of the semiconductor layer 302 may have a planar structure. More specifically, top surfaces of the second and third regions R32 and R33 of the semiconductor layer 302 may be located at the same horizontal level to provide a planar structure. In addition, bottom surfaces of the first to third regions R31, R32 and R33 of the semiconductor layer 302 may be located at the same horizontal level to provide a planar structure.

In the first region R31, a first gate insulation layer 312 and a second gate insulation layer 314 may be disposed at both regions of the trench T along a channel length direction, respectively. The first gate insulation layer 312 may include a first vertical gate insulation layer 312A disposed along a vertical boundary line between the first and second regions R31 and R32 and a first horizontal gate insulation layer 312B extending from the first vertical gate insulation layer 312A along the bottom surface of the trench T by a certain length. The second gate insulation layer 314 may include a second vertical gate insulation layer 314A disposed along a vertical boundary line between the first and third regions R31 and R33 and a second horizontal gate insulation layer 314B extending from the second vertical gate insulation layer 314A along the bottom surface of the trench T by a certain length. The first and second gate insulation layers 312 and 314 may be the same insulation layer. The first and second gate insulation layers 312 and 314 may be made of the same insulation material. The first and second gate insulation layers 312 and 314 may be formed simultaneously. The first and second gate insulation layers 312 and 314 may have the same thickness or substantially the same thickness. In an embodiment, the first and second gate insulation layers 312 and 314 may be made of or include a silicon oxide (SiO$_2$) layer.

In the first region R31, a variable resistive material layer 320 may be disposed between the first horizontal gate insulation layer 312B and the second horizontal gate insulation layer 314B. In an embodiment, the variable resistive material layer 320 may be disposed such that a lower portion of the variable resistive material layer 320 is embedded in the semiconductor layer 302 beneath the bottom surface of the trench T by a certain depth. A top surface of the variable resistive material layer 320 may be located at a level which is higher than a level of top surfaces of the first and second horizontal gate insulation layers 312B and 314B. Lower portions of side surfaces of the variable resistive material layer 320 and an entire portion of the bottom surface of the variable resistive material layer 320 may be in direct contact with the semiconductor layer 302 in the first region R31. A portion of one side surface of the variable resistive material layer 320 may be in direct contact with a side surface of the first horizontal gate insulation layer 312B. A portion of another side surface of the variable resistive material layer 320 may be in direct contact with a side surface of the second horizontal gate insulation layer 314B. As illustrated in FIG. 16, the variable resistive material layer 320 may be partially embedded in the bottom surface of the trench T of the first region R31 and in direct contact with the first and second horizontal gate insulation layers 312B and 314B.

In an embodiment, the variable resistive material layer 320 may be made of a resistive dielectric material whose resistance value (i.e., resistive state) may vary according to a voltage pulse applied to the variable resistive material layer 320. The resistive dielectric layer may be any of a metal oxide material layer such as a hafnium oxide (HfOx) layer, a tantalum oxide (TaOx) layer, a titanium oxide (TiOx) layer, an aluminum oxide (AlOx) layer or a vanadium oxide (VOx) layer. The oxygen composition "x" in an upper portion of the metal oxide material layer may be different from the oxygen composition "x" in a lower portion of the metal oxide material layer. For example, the oxygen composition "x" in a lower portion of the metal oxide material layer may be greater than the oxygen composition "x" in an upper portion of the metal oxide material layer. In another embodiment, the variable resistive material layer 320 may be made of a phase changeable material having a resistance value (i.e., resistive state) which may vary according to a current flowing through the variable resistive material layer 320. The phase changeable material layer may be a chalcogenide material layer whose resistive state is changed into a crystalline state or an amorphous state according to temperature variation. In an embodiment, the chalcogenide material layer may be an alloy of germanium (Ge), stibium (Sb) and tellurium (Te), which is called a GST layer.

An insulation barrier layer 330 may be disposed on an entire portion of the top surface and the portions of the side surfaces of the variable resistive material layer 320 which are not in contact with the first and second horizontal gate insulation layers 312B, 314B. The insulation barrier layer 330 may be disposed to cover a protrusion of the variable resistive material layer 320 protruding from the top surface of the semiconductor layer 302 in the first region R31 together with the first and second horizontal gate insulation layers 312B and 314B. Although not shown in the drawings, the insulation barrier layer 330 may include a plurality of insulation layers. In an embodiment, the insulation barrier layer 330 may be comprised of the same material layer as the first and second gate insulation layers 312 and 314. In an embodiment, the insulation barrier layer 330 may be made of or include a silicon oxide (SiO$_2$) layer.

A gate electrode 340 may be disposed to fill the trench T. Thus, the gate electrode 340 may be in direct contact with the first and second gate insulation layers 312 and 314 and may also be in direct contact with the side surfaces and the top surface of the insulation barrier layer 330. A top surface of the gate electrode 340 may be located at a horizontal level which is lower than a top surface of the semiconductor layer 302 in the second and third regions R32 and R33. In an embodiment, the gate electrode 340 may be made or include a doped polysilicon layer. In an embodiment, the gate electrode 340 may be made or include a metal layer.

A first impurity diffusion region 352 may be disposed in an upper portion of the second region R32 of the semiconductor layer 302. A second impurity diffusion region 354 may be disposed in an upper portion of the third region R33 of the semiconductor layer 302. The first and second impurity diffusion regions 352 and 354 may have a conductivity type which is different from or opposite to a conductivity type of the semiconductor layer 302. For example, when the semiconductor layer 302 is a P-type semiconductor layer, the first and second impurity diffusion regions 352 and 354 may be N-type regions which are heavily doped with N-type impurities. The first impurity diffusion region 352 may have a first junction depth HJ31 from the top surface of the second region R32 of the semiconductor layer 302. The second impurity diffusion region 354 may have a second junction depth HJ32 from the top surface of the third region R33 of the semiconductor layer 302. The first junction depth H331 may be equal or substantially equal to the second junction depth HJ32. In an embodiment, bottom surfaces of the first and second impurity diffusion regions 352 and 354 may be located at the same horizontal level as the top surface of the gate electrode 340.

An interlayer insulation layer 360 may be disposed on the gate electrode 340, the first and second gate insulation layers 312 and 314, and the first and second impurity diffusion regions 352 and 354. The interlayer insulation layer 360 may have first to third via holes therein. The first to third via holes may penetrate the interlayer insulation layer 360 to expose the gate electrode 340, the first impurity diffusion region 352 and the second impurity diffusion region 354, respectively. The first via hole may be filled with a first contact plug 372 which is electrically connected to the gate electrode 340. The first contact plug 372 may be disposed centrally above the gate electrode 340. The second via hole may be filled with a second contact plug 374 which is electrically connected to the first impurity diffusion region 352. The second contact plug 374 may be disposed centrally above the first impurity diffusion region 352. The third via hole may be filled with a third contact plug 376 which is electrically connected to the second impurity diffusion region 354. The third contact plug 376 may be disposed centrally above the second impurity diffusion region 354. In an embodiment, the first to third contact plugs 372, 374 and 376 may be comprised of a metal. A first electrode 382, a second electrode 384 and a third electrode 386 may be disposed on the interlayer insulation layer 360. The first electrode 382 may be electrically connected to the first contact plug 372. The second electrode 384 may be electrically connected to the second contact plug 374. The third electrode 386 may be electrically connected to the third contact plug 376.

Figure 17:
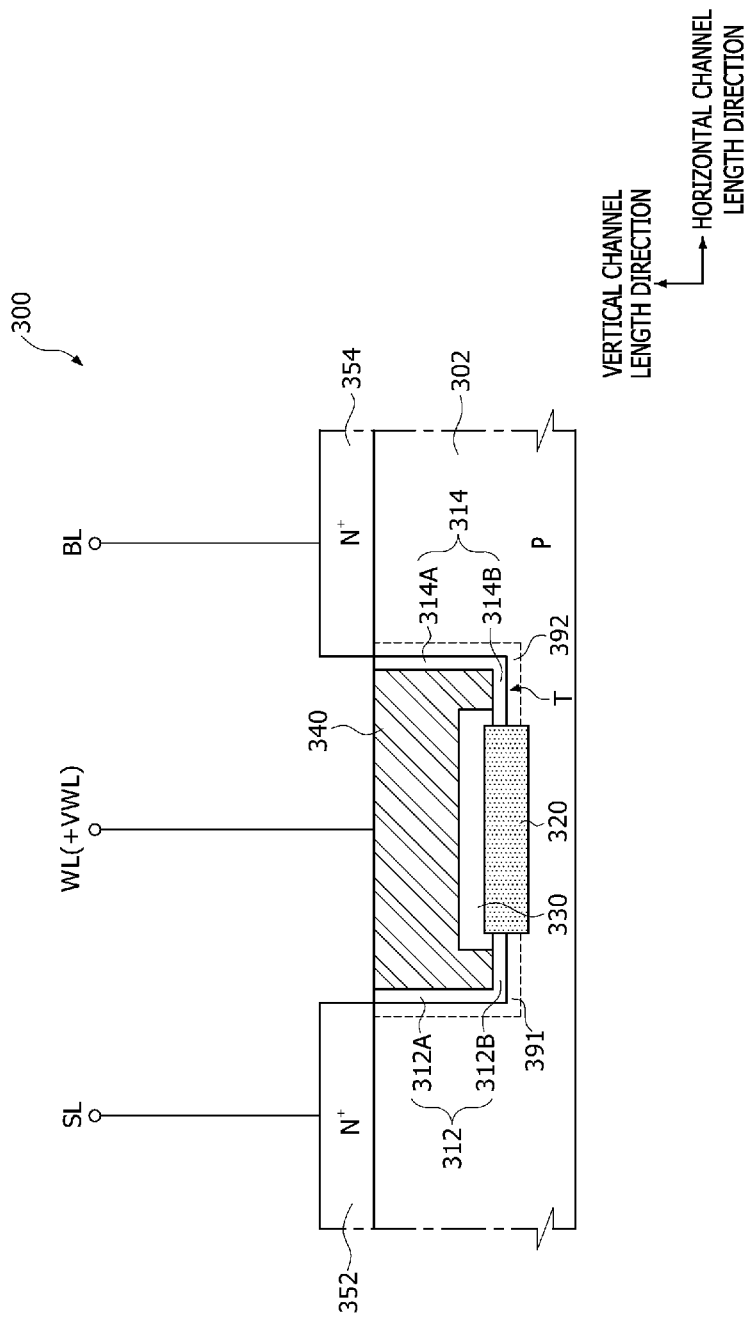
FIG. 17 is a cross-sectional view illustrating a cell selection operation of a nonvolatile memory cell according to another embodiment of the present disclosure.

FIG. 17 is a cross-sectional view illustrating the cell selection operation of the nonvolatile memory cell 300 shown in FIG. 16. In FIG. 17, the same reference numerals as used in FIG. 16 denote the same elements. In FIG. 17, the illustration of the interlayer insulation layer 360 of FIG. 16, the first to third contact plugs 372, 374 and 376 of FIG. 16, and the first to third electrodes 382, 384 and 386 of FIG. 16 is omitted, and a word line WL, a source line SL and a bit line BL are illustrated as voltage application lines. Referring to FIG. 17, the cell selection operation of the nonvolatile memory cell 300 may be achieved according to a magnitude of the word line voltage VWL applied to the word line WL. A polarity of the word line voltage VWL may be set to be different according to whether the nonvolatile memory cell 300 has an N-channel structure or a P-channel structure.

The cell selection operation of the nonvolatile memory cell 300 will be described hereinafter for a case in which the nonvolatile memory cell 300 has an N-channel structure (i.e., the semiconductor layer 302 has a P-type conductivity and the first and second impurity diffusion regions 352 and 354 have an N-type conductivity). In such a case, in order to select the nonvolatile memory cell 300, a positive word line voltage +VWL higher than a threshold voltage of the nonvolatile memory cell 300 having a MOS structure may be applied to the word line WL. When the positive word line voltage +VWL is applied to the word line WL, a first channel 391 corresponding to an N-type inversion layer may be formed in the P-type semiconductor layer 302 adjacent to the first vertical gate insulation layer 312A and the first horizontal gate insulation layer 312B. In addition, when the positive word line voltage +VWL is applied to the word line WL, a second channel 392 corresponding to an N-type inversion layer may also be formed in the P-type semiconductor layer 302 adjacent to the second vertical gate insulation layer 314A and the second horizontal gate insulation layer 314B. Thus, the first channel 391 may act as a current path between the first impurity diffusion region 352 and one end of the variable resistive material layer 320. Similarly, the second channel 392 may also act as a current path between the second impurity diffusion region 354 and the other end of the variable resistive material layer 320. If an appropriate bias is applied between the source line SL and the bit line BL while the positive word line voltage +VWL is applied to the word line WL, any one of the set operation, the reset operation and the read operation may be performed.

In order for the nonvolatile memory cell 300 not to be selected, a word line voltage (e.g., a ground voltage) lower than the threshold voltage of the nonvolatile memory cell 300 having a MOS structure may be applied to the word line WL. Under this bias condition, no channel is formed in the P-type semiconductor layer 102 adjacent to the first and second gate insulation layers 312 and 314. Accordingly, no current path is formed between the first impurity diffusion region 352 and one end of the variable resistive material layer 320 as well as between the second impurity diffusion region 354 and the other end of the variable resistive material layer 320. When the word line voltage (e.g., a ground voltage) lower than the threshold voltage of the nonvolatile memory cell 300 having a MOS structure is applied to the word line WL, not one of the set operation, the reset operation and the read operation may be achieved even though a bias is applied between the source line SL and the bit line BL.

Figure 18:
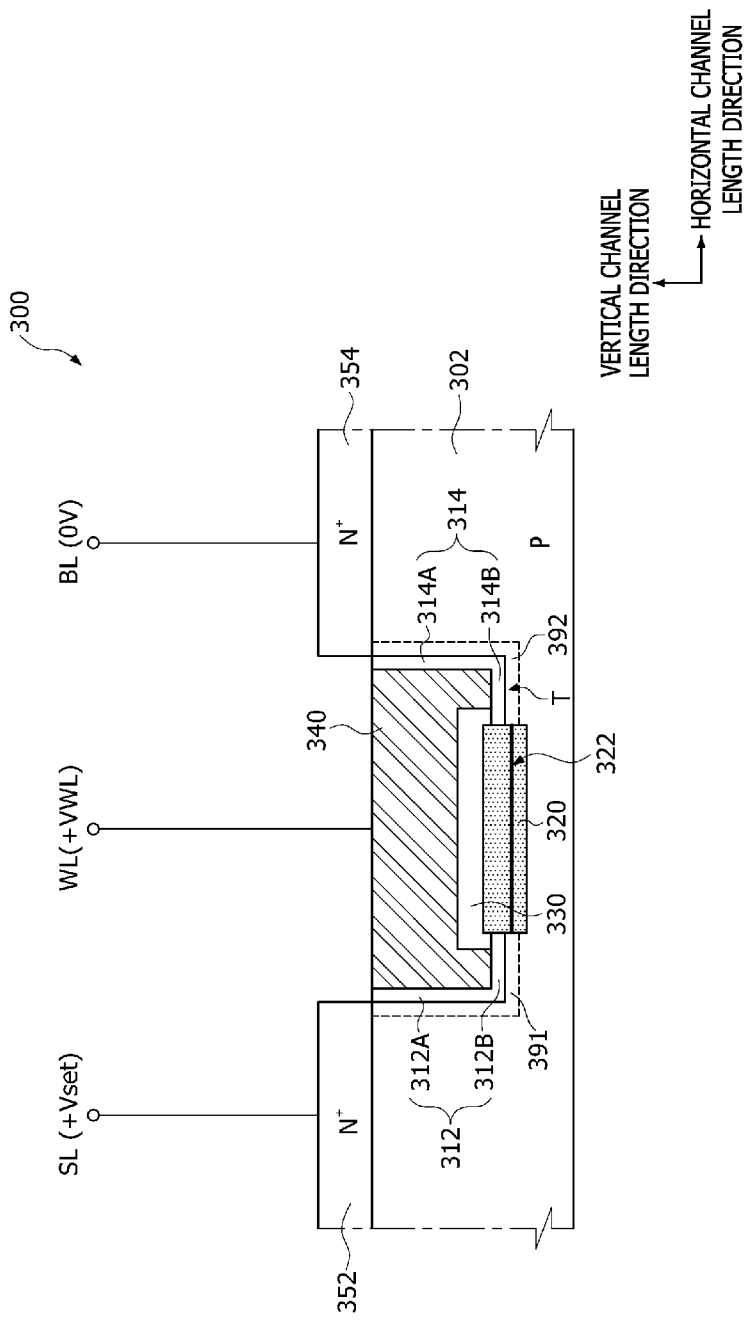
FIG. 18 is a cross-sectional view illustrating an example of a set operation of a nonvolatile memory cell according to another embodiment of the present disclosure.

FIG. 18 is a cross-sectional view illustrating an example of the set operation of the nonvolatile memory cell 300 shown in FIG. 16. In FIG. 18, the same reference numerals and symbols as used in FIG. 17 denote the same elements. A positive polarity of various voltages used in the following set operation is merely an example of suitable polarities. Accordingly, it may be apparent that only negative voltages or both positive and negative voltages may also be used to perform the set operation according to various embodiments. As described with reference to FIG. 17, the nonvolatile memory cell 300 is selected by forming the first and second channels 391 and 392 to perform the set operation. In addition, the following set operation will be described for a case in which the variable resistive material layer 320 of the nonvolatile memory cell 300 comprises a resistive dielectric layer. Referring to FIG. 18, in order to selectively perform the set operation of the nonvolatile memory cell 300, a positive set voltage +Vset may be applied to the source line SL and the ground voltage 0V may be applied to the bit line BL. If voltage drops across all of the elements (e.g., the source line SL, the bit line BL, the first and second impurity diffusion regions 352 and 354, and the first and second channels 391 and 392) are neglected, the positive set voltage +Vset may be applied to one end of the variable resistive material layer 320 through the first impurity diffusion region 352 and the first channel 391 and the ground voltage 0V may be applied to the other end of the variable resistive material layer 320 through the second impurity diffusion region 354 and the second channel 392. In such a case, a lateral electric field may be created in the variable resistive material layer 320 due to a voltage pulse of the positive set voltage +Vset in the horizontal channel length direction, thereby forming a conductive filament 322 along the horizontal channel length direction. Accordingly, a resistive state of the variable resistive material layer 320 may be changed from a high resistive state into a low resistive state. In an embodiment, the low resistive state of the variable resistive material layer 320 may be defined as a binary number "0".

Figure 19:
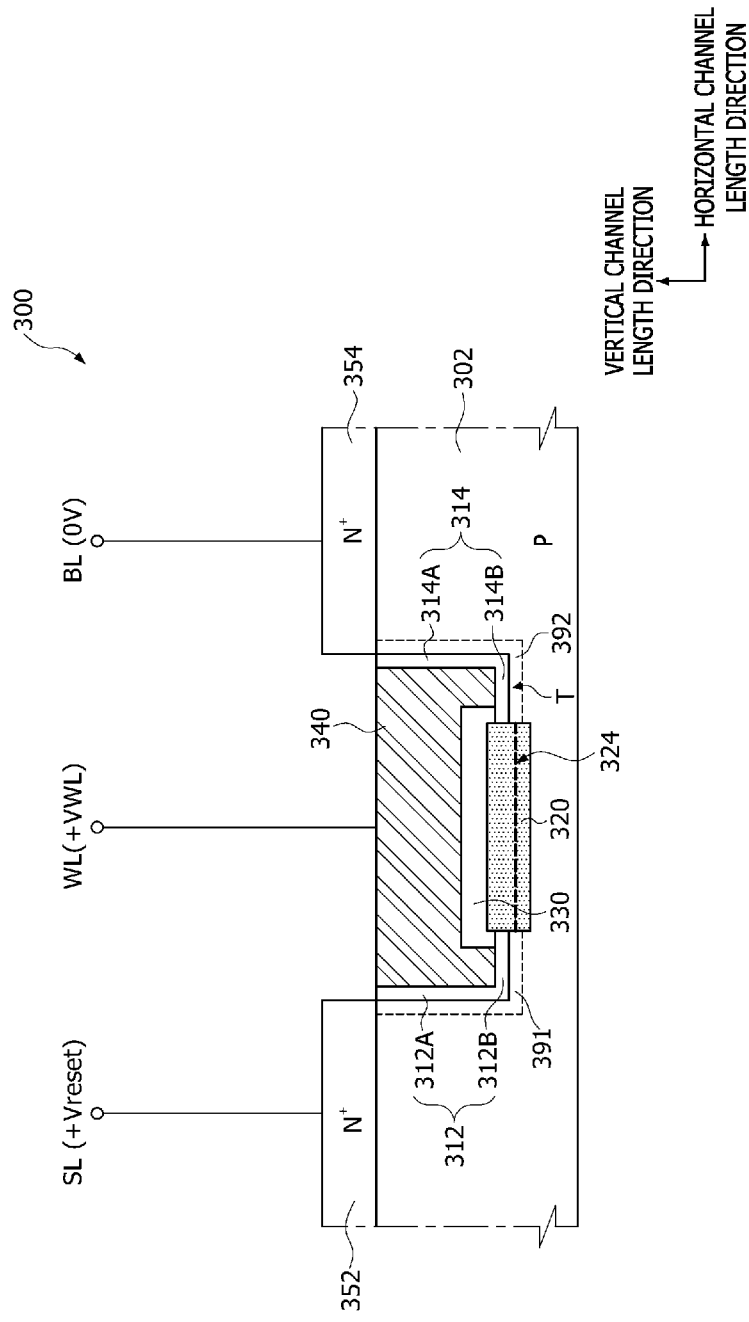
FIG. 19 is a cross-sectional view illustrating an example of a reset operation of a nonvolatile memory cell according to another embodiment of the present disclosure.

FIG. 19 is a cross-sectional view illustrating an example of the reset operation of the nonvolatile memory cell 300 shown in FIG. 16. In FIG. 19, the same reference numerals and symbols as used in FIG. 17 denote the same elements. A positive polarity of various voltages used in the following reset operation is merely an example of suitable polarities. Accordingly, it may be apparent that only negative voltages or both of positive and negative voltages may also be used to perform the reset operation according to various embodiments. As described with reference to FIG. 17, the nonvolatile memory cell 300 is selected by forming the first and second channels 391 and 392 to perform the reset operation. In addition, the following reset operation will be described for a case in which the variable resistive material layer 320 of the nonvolatile memory cell 300 comprises a resistive dielectric layer. Referring to FIG. 19, in order to selectively perform the reset operation of the nonvolatile memory cell 300, a positive reset voltage +Vreset may be applied to the source line SL and the ground voltage 0V may be applied to the bit line BL. If voltage drops across all of the elements (e.g., the source line SL, the bit line BL, the first and second impurity diffusion regions 352 and 354, and the first and second channels 391 and 392) are neglected, the positive reset voltage +Vreset may be applied to one end of the variable resistive material layer 320 through the first impurity diffusion region 352 and the first channel 391 and the ground voltage 0V may be applied to the other end of the variable resistive material layer 320 through the second impurity diffusion region 354 and the second channel 392. In such a case, a lateral electric field may be created in the variable resistive material layer 320 due to a voltage pulse of the positive reset voltage +Vreset in the horizontal channel length direction, thereby forming a ruptured conductive filament 324 along the horizontal channel length direction. Accordingly, a resistive state of the variable resistive material layer 320 may be changed from a low resistive state into a high resistive state. In an embodiment, the high resistive state of the variable resistive material layer 120 may be defined as a binary number "1".

According to the examples described with reference to FIGS. 18 and 19, in order to perform the set operation or the reset operation, the positive set voltage +Vset or the positive reset voltage +Vreset may be applied to the source line SL and the ground voltage 0V may be applied to the bit line BL. However, the above bias condition is merely an example of various bias conditions for performing the set operation or the reset operation. That is, the opposite bias condition may also be applied to the nonvolatile memory cell 300 to perform the set operation or the reset operation. For example, the set operation or the reset operation may be performed by applying the positive set voltage +Vset or the positive reset voltage +Vreset to the bit line BL and applying the ground voltage to the source line SL. The resistive dielectric layer used as the variable resistive material layer 320 may have a bidirectional characteristic. Thus, the positive set voltage +Vset may be applied to the source line SL to perform the set operation, and the positive reset voltage +Vreset may be applied to the bit line BL to perform the reset operation. Similarly, the positive set voltage +Vset may be applied to the bit line BL to perform the set operation, and the positive reset voltage +Vreset may be applied to the source line SL to perform the reset operation.

Figure 20:
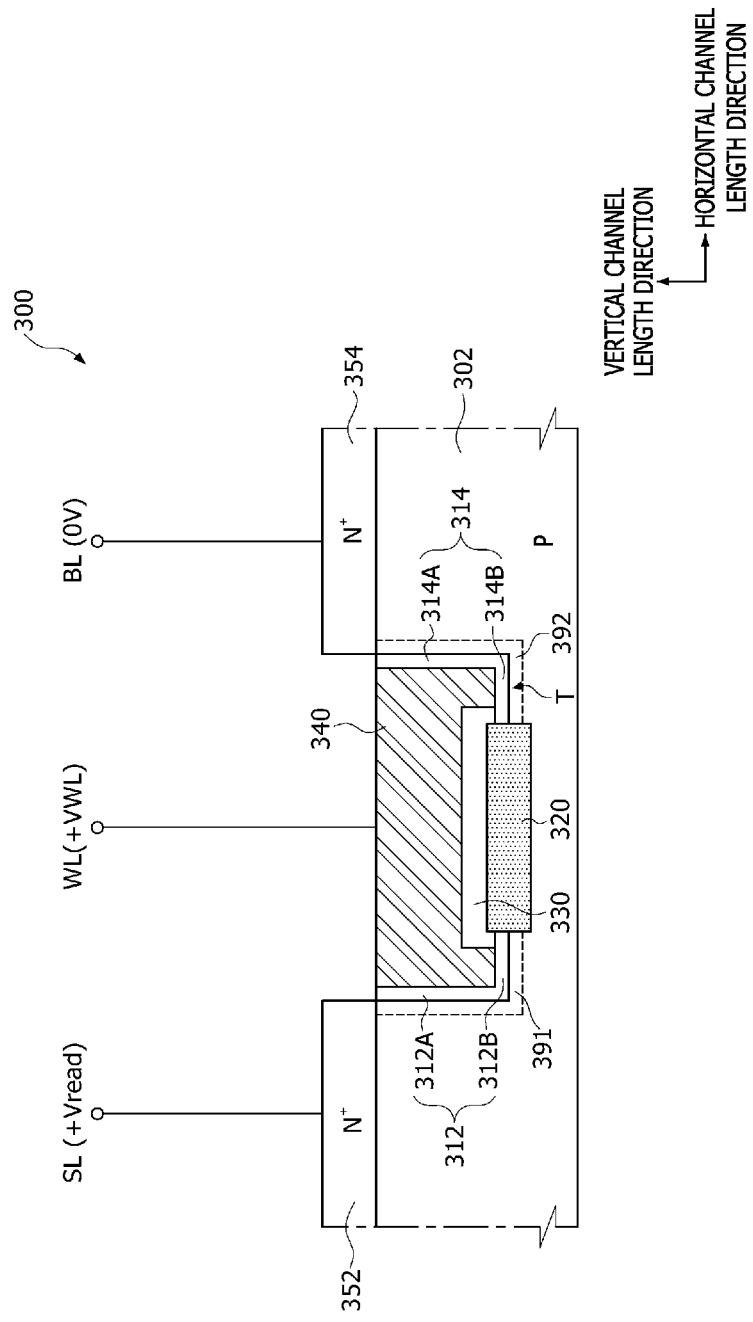
FIG. 20 is a cross-sectional view illustrating an example of a read operation of a nonvolatile memory cell according to another embodiment of the present disclosure.

FIG. 20 is a cross-sectional view illustrating an example of the read operation of the nonvolatile memory cell 300 shown in FIG. 16. In FIG. 20, the same reference numerals and symbols as used in FIG. 17 denote the same elements. As described with reference to FIG. 17, the nonvolatile memory cell 300 is selected by forming the first and second channels 391 and 392 to perform the read operation. In addition, the following read operation will be described for a case in which the variable resistive material layer 320 of the nonvolatile memory cell 300 comprises a resistive dielectric layer. A positive polarity of various voltages used in the following read operation is merely an example of suitable polarities. Accordingly, it may be apparent that only negative voltages or both positive and negative voltages may also be used to perform the read operation according to various embodiments. Referring to FIG. 20, in order to selectively perform the read operation of the nonvolatile memory cell 300, a positive read voltage +Vread may be applied to the source line SL and the ground voltage 0V may be applied to the bit line BL. In an embodiment, the positive read voltage +Vread may have a magnitude between the positive reset voltage +Vreset and the positive set voltage +Vset. If voltage drops across all of the elements (e.g., the source line SL, the bit line BL, the first and second impurity diffusion regions 352 and 354, and the first and second channels 391 and 392) are neglected, the positive read voltage +Vread may be applied to one end of the variable resistive material layer 320 through the first impurity diffusion region 352 and the first channel 391 and the ground voltage 0V may be applied to the other end of the variable resistive material layer 320 through the second impurity diffusion region 354 and the second channel 392. In such a case, because a lateral electric field is created in the variable resistive material layer 320 due to the positive read voltage +Vread applied between both ends of the variable resistive material layer 320 in the horizontal channel length direction, current may flow from the source line SL toward the bit line BL or no current may flow through the source line SL and the bit line BL, according to a resistive state of the variable resistive material layer 320.

When the variable resistive material layer 320 has a low resistive state as a result of the set operation, a current due to the positive read voltage +Vread may flow from the source line SL toward the bit line BL through the variable resistive material layer 320. In such a case, the current flowing through the bit line BL may be sensed by a sensing circuit coupled to the bit line BL, and the nonvolatile memory cell 300 may be regarded as having a binary number "0". When the variable resistive material layer 320 has a high resistive state as a result of the reset operation, no current may flow from the source line SL toward the bit line BL even though the positive read voltage +Vread is applied between both ends of the variable resistive material layer 320. Accordingly, no current may be sensed by the sensing circuit coupled to the bit line BL, and the nonvolatile memory cell 300 may be regarded as having a binary number "1".

Figure 21:
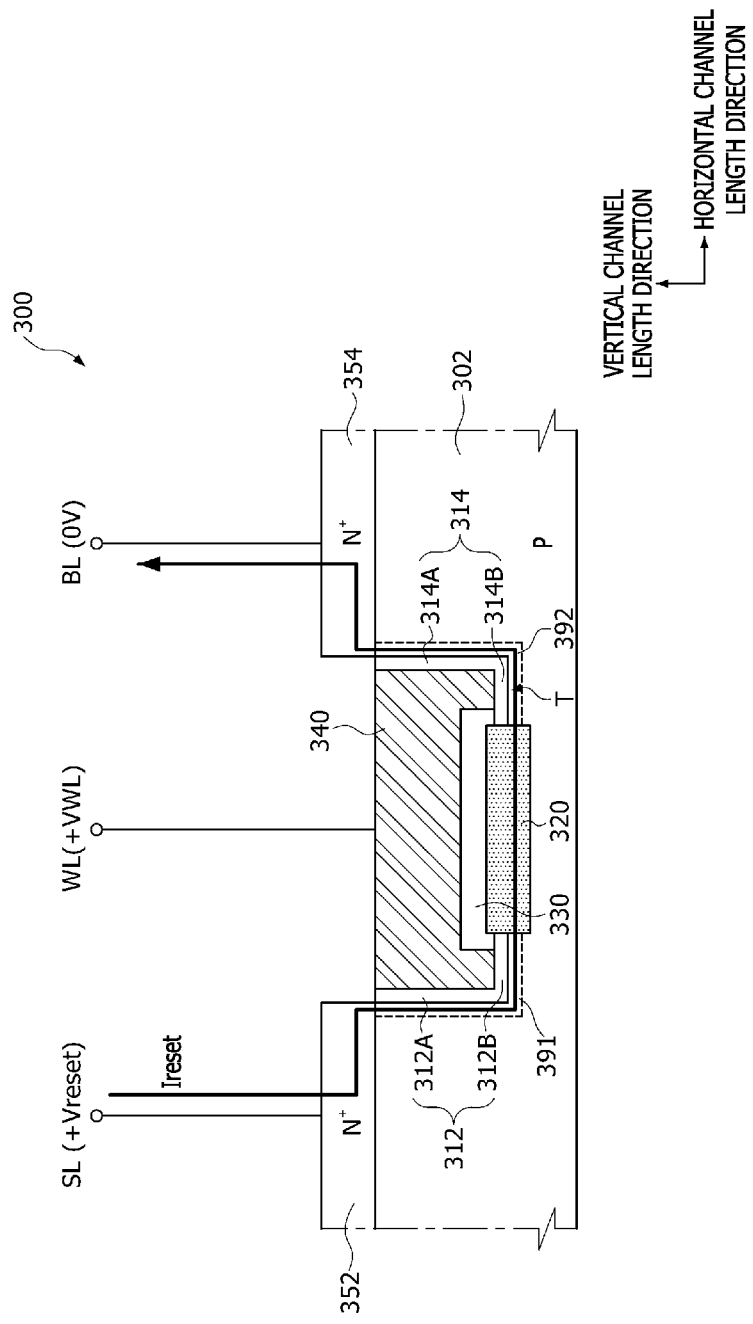
FIG. 21 is a cross-sectional view illustrating another example of a reset operation of a nonvolatile memory cell according to another embodiment of the present disclosure.

FIG. 21 is a cross-sectional view illustrating another example of the reset operation of the nonvolatile memory cell 300 shown in FIG. 16. In FIG. 21, the same reference numerals and symbols as used in FIG. 17 denote the same elements. A positive polarity of various voltages used in the following reset operation is merely an example of suitable polarities. Accordingly, it may be apparent that only negative voltages or both positive and negative voltages may also be used to perform the reset operation according to various embodiments. As described with reference to FIG. 17, the nonvolatile memory cell 300 is selected by forming the first and second channels 391 and 392 to perform the reset operation. In addition, the following reset operation will be described for a case in which the variable resistive material layer 320 of the nonvolatile memory cell 300 comprises a phase changeable material layer. Referring to FIG. 21, in order to selectively perform the reset operation of the nonvolatile memory cell 300, a positive reset voltage +Vreset having a pulse form with a relatively high magnitude and a relatively narrow width may be applied to the source line SL and the ground voltage 0V may be applied to the bit line BL. Because of the presence of the first and second channels 391 and 392 previously formed, a large reset current Ireset may flow from the source line SL toward the bit line BL through the first channel 391, the variable resistive material layer 320 and the second channel 392 when the positive reset voltage +Vreset is applied to the source line SL. In such a case, the variable resistive material layer 320 may be heated by the reset current Ireset to a temperature over a melting point thereof during a relatively short period to have a melted pool therein and may be cooled down rapidly to have an amorphous phase. The variable resistive material layer 320 having the amorphous phase may exhibit a high resistive state which is defined as a binary number "1".

Figure 22:
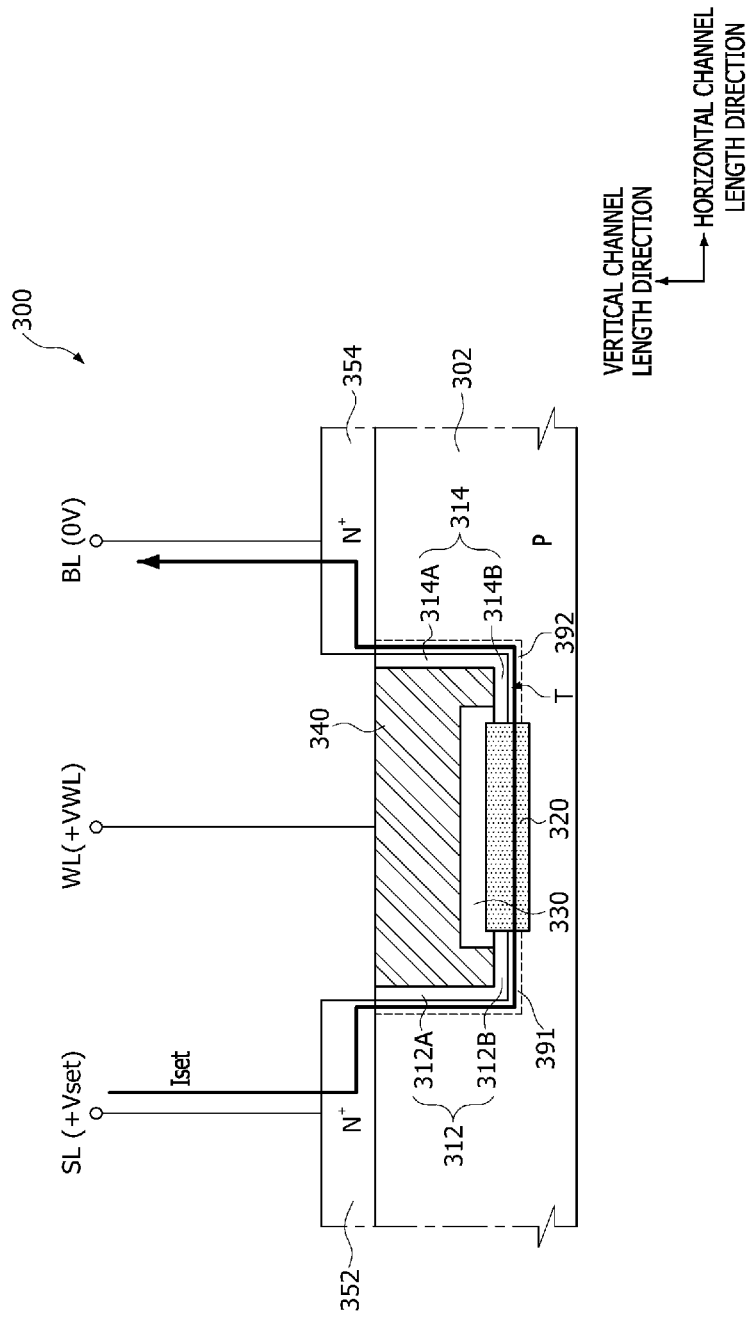
FIG. 22 is a cross-sectional view illustrating another example of a set operation of a nonvolatile memory cell according to another embodiment of the present disclosure.

FIG. 22 is a cross-sectional view illustrating another example of the set operation of the nonvolatile memory cell 300 shown in FIG. 16. In FIG. 22, the same reference numerals and symbols as used in FIG. 17 denote the same elements. A positive polarity of various voltages used in the following set operation is merely an example of suitable polarities. Accordingly, it may be apparent that only negative voltages or both positive and negative voltages may also be used to perform the set operation according to various embodiments. As described with reference to FIG. 17, the nonvolatile memory cell 300 is selected by forming the first and second channels 391 and 392 to perform the set operation. In addition, the following set operation will be described for a case in which the variable resistive material layer 320 of the nonvolatile memory cell 300 comprises a phase changeable material layer. Referring to FIG. 22, in order to selectively perform the set operation of the nonvolatile memory cell 300, a positive set voltage +Vset having a pulse form may be applied to the source line SL and the ground voltage 0V may be applied to the bit line BL. The positive set voltage +Vset may have a magnitude which is less than a magnitude of the positive reset voltage +Vreset illustrated in FIG. 21. Because of the presence of the first and second channels 391 and 392 previously formed, a set current Iset smaller than the reset current Ireset may flow from the source line SL toward the bit line BL through the first channel 391, the variable resistive material layer 320 and the second channel 392 when the positive set voltage +Vset is applied to the source line SL. In such a case, the variable resistive material layer 320 may be heated by the set current Iset to a temperature which is in the range of a crystallization temperature thereof to the melting point during a relatively long period to have a crystalline phase. The variable resistive material layer 320 having the crystalline phase may exhibit a low resistive state which is defined as a binary number "0".

Figure 23:
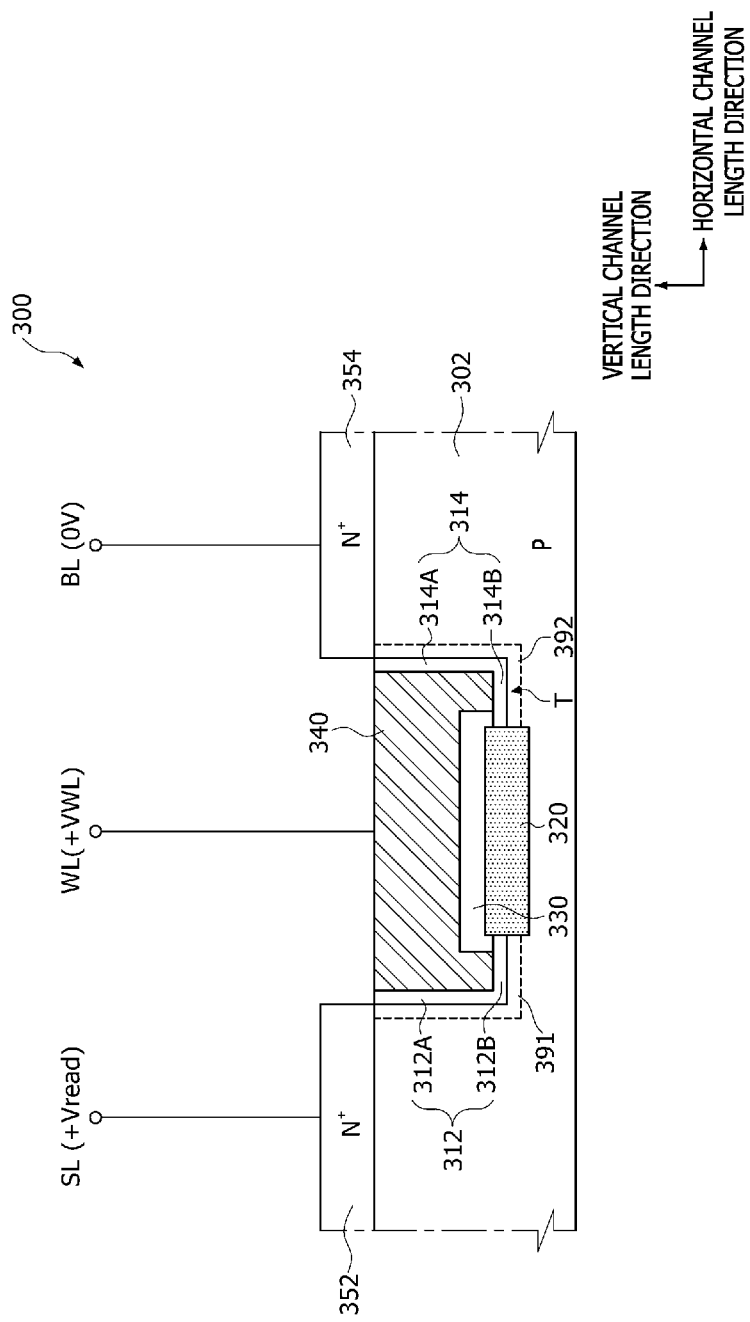
FIG. 23 is a cross-sectional view illustrating another example of a read operation of a nonvolatile memory cell according to another embodiment of the present disclosure.

FIG. 23 is a cross-sectional view illustrating another example of the read operation of the nonvolatile memory cell 300 shown in FIG. 16. In FIG. 23, the same reference numerals and symbols as used in FIG. 17 denote the same elements. A positive polarity of various voltages used in the following set operation is merely an example of suitable polarities. Accordingly, it may be apparent that only negative voltages or both positive and negative voltages may also be used to perform the set operation according to various embodiments. As described with reference to FIG. 17, the nonvolatile memory cell 300 is selected by forming the first and second channels 391 and 392 to perform the read operation. In addition, the following read operation will be described for a case in which the variable resistive material layer 320 of the nonvolatile memory cell 300 comprises a phase changeable material layer. Referring to FIG. 23, in order to selectively perform the read operation of the nonvolatile memory cell 300, a positive read voltage +Vread may be applied to the source line SL and the ground voltage 0V may be applied to the bit line BL. In an embodiment, the positive read voltage +Vread may have a magnitude between the positive reset voltage +Vreset and the positive set voltage +Vset. If voltage drops across all of the elements (e.g., the source line SL, the bit line BL, the first and second impurity diffusion regions 352 and 354, and the first and second channels 391 and 392) are neglected, the positive read voltage +Vread may be applied to one end of the variable resistive material layer 320 through the first impurity diffusion region 352 and the first channel 391, and the ground voltage 0V may be applied to the other end of the variable resistive material layer 320 through the second impurity diffusion region 354 and the second channel 392. In such a case, because a lateral electric field is created in the variable resistive material layer 320 due to the positive read voltage +Vread applied between both ends of the variable resistive material layer 320 in the horizontal channel length direction, current may flow from the source line SL toward the bit line BL or no current may flow through the source line SL and the bit line BL, according to a resistive state of the variable resistive material layer 320.

When the variable resistive material layer 320 has a crystalline phase (i.e., a low resistive state) as a result of the set operation, a current due to the positive read voltage +Vread may flow from the source line SL toward the bit line BL through the variable resistive material layer 320. In such a case, the current flowing through the bit line BL may be sensed by a sensing circuit coupled to the bit line BL, and the nonvolatile memory cell 300 may be regarded as having a binary number "0". When the variable resistive material layer 320 has an amorphous phase (i.e., a high resistive state) as a result of the reset operation, no current may flow from the source line SL toward the bit line BL even though the positive read voltage +Vread is applied between both ends of the variable resistive material layer 320. Accordingly, no current may be sensed by the sensing circuit coupled to the bit line BL, and the nonvolatile memory cell 300 may be regarded as having a binary number "1".

An equivalent circuit of the nonvolatile memory cell 300 may be the same as the equivalent circuit of the nonvolatile memory cell 100 described with reference to FIG. 2. Thus, a cell array employing the nonvolatile memory cell 300 as a unit cell may also be the same as the nonvolatile memory cell array 200 described with reference to FIG. 10. A set operation of a single cell selected from a plurality unit cells included in a nonvolatile memory cell array employing the nonvolatile memory cell 300 as the unit cell may be performed using the same way as described with reference to FIG. 11, and a set operation of at least two cells selected from a plurality unit cells included in a nonvolatile memory cell array employing the nonvolatile memory cell 300 as the unit cell may be performed using the same way as described with reference to FIG. 12. A reset operation of a single cell selected from a plurality unit cells included in a nonvolatile memory cell array employing the nonvolatile memory cell 300 as the unit cell may be performed using the same way as described with reference to FIG. 13, and a set operation of at least two cells selected from a plurality unit cells included in a nonvolatile memory cell array employing the nonvolatile memory cell 300 as the unit cell may be performed using the same way as described with reference to FIG. 14. In addition, a read operation of a single cell selected from a plurality unit cells included in a nonvolatile memory cell array employing the nonvolatile memory cell 300 as the unit cell may be performed using the same way as described with reference to FIG. 15.

Embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:
1. A nonvolatile memory cell comprising:
a semiconductor layer including a first recess and a second recess;
a first gate insulation layer disposed on a bottom surface and side surfaces of the first recess;
a second gate insulation layer disposed on a bottom surface and side surfaces of the second recess;
a variable resistive material layer disposed on a first region of the semiconductor layer disposed between the first and second recesses;
an insulation barrier layer disposed on a top surface and side surfaces of the variable resistive material layer; and
a gate electrode surrounding the insulation barrier layer and extending to fill the first and second recesses.
2. The nonvolatile memory cell of claim 1, further comprising:
a first impurity diffusion region and a second impurity diffusion region disposed in upper portions of a second region and a third region of the semiconductor layer which abut the first and second recesses, respectively.

3. The nonvolatile memory cell of claim 2,
wherein the second and third regions are disposed to be symmetrical to each other with respect to the first region; and
wherein the first and second recesses are formed in fourth and fifth regions of the semiconductor layer; and
wherein the fourth and fifth regions of the semiconductor layer are disposed to be symmetrical to each other with respect to the first region.

4. The nonvolatile memory cell of claim 3, wherein a depth of the first recess is equal or substantially equal to a depth of the second recess and wherein a second surface height of the semiconductor layer in the fourth and fifth regions is less than a first surface height of the semiconductor layer in the first, second and third regions.

5. The nonvolatile memory cell of claim 3,
wherein bottom surfaces of the first to fifth regions of the semiconductor layer are located at the same horizontal level to provide a planar structure;
wherein top surfaces of the first to third regions of the semiconductor layer are located at the same horizontal level to provide a planar structure; and
wherein top surfaces of the fourth and fifth regions of the semiconductor layer are located at the same horizontal level to provide a planar structure.

6. The nonvolatile memory cell of claim 3,
wherein a first vertical channel region is provided in the semiconductor layer adjacent to a side surface of the first recess opposite to the second region, and a first horizontal channel region is provided in the semiconductor layer adjacent to a bottom surface of the first recess; and
wherein a second vertical channel region is provided in the semiconductor layer adjacent to a side surface of the second recess opposite to the third region, and a second horizontal channel region is provided in the semiconductor layer adjacent to a bottom surface of the second recess.

7. The nonvolatile memory cell of claim 3, wherein a bottom surface of the variable resistive material layer is in direct contact with an entire portion of a top surface of the semiconductor layer in the first region.

8. The nonvolatile memory cell of claim 1, wherein the variable resistive material layer is a resistive dielectric layer whose resistive state varies according to a voltage pulse applied to the variable resistive material layer.

9. The nonvolatile memory cell of claim 8,
wherein the resistive dielectric layer is a metal oxide material layer; and
wherein an oxygen composition in a lower portion of the metal oxide material layer is greater than an oxygen composition in an upper portion of the metal oxide material layer.

10. The nonvolatile memory cell of claim 1, wherein the variable resistive material layer is a phase changeable material layer whose resistive state varies according to a current flowing through variable resistive material layer.

11. The nonvolatile memory cell of claim 2, wherein a junction depth of the first and second impurity diffusion regions is greater than a depth of the first and second recesses.

12. A nonvolatile memory cell comprising:
a gate terminal, a source terminal and a drain terminal coupled to a word line, a source line and a bit line, respectively;
a resistor coupled between the source terminal and the drain terminal and comprised of a variable resistive material layer;
a first channel region provided between the resistor and the source terminal; and
a second channel region provided between the resistor and the drain terminal,
wherein whether a first channel and a second channel are formed in the first and second channel regions, respectively, is determined according to a word line voltage applied to the word line.

13. The nonvolatile memory cell of claim 12,
wherein a set operation or a reset operation for determining a resistive state of the resistor is performed by applying a voltage pulse between the source line and the bit line while the first channel and the second channel are formed by the word line voltage applied to the word line; and
wherein a read operation for reading out the resistive state of the resistor is performed by discriminating whether current flows through the bit line, the resistor and the source line while the first channel and the second channel are formed by the word line voltage applied to the word line.

14. A nonvolatile memory cell array comprising:
a first word line coupled to a first unit cell and a second unit cell;
a second word line coupled to a third unit cell and a fourth unit cell;
a first source line coupled to the first and third unit cells;
a second source line coupled to the second and fourth unit cells; and
a bit line coupled to the first to fourth unit cells,
wherein each of the first to fourth unit cells includes:
a gate terminal coupled to any one of the first and second word lines;
a source terminal coupled to any one of the first and second source lines;
a drain terminal coupled to the bit line;
a resistor coupled between the source terminal and the drain terminal and comprised of a variable resistive material layer;
a first channel region provided between the resistor and the source terminal; and
a second channel region provided between the resistor and the drain terminal,
wherein whether a first channel and a second channel are formed in the first and second channel regions, respectively, is determined according to a voltage applied to the gate terminal.

15. The nonvolatile memory cell array of claim 14, wherein a set operation of the first unit cell among the first to fourth unit cells is performed by applying a word line voltage for forming the first and second channels to the first word line, by applying a ground voltage to the second word line, by applying a set voltage and the ground voltage to the first source line and the bit line, respectively, and by electrically floating the second source line.

16. The nonvolatile memory cell array of claim 14, wherein a set operation of the first and second unit cells sharing the first word line among the first to fourth unit cells is performed by applying a word line voltage for forming the first and second channels to the first word line, by applying a ground voltage to the second word line, by applying a set voltage to the first and second source lines, and by applying the ground voltage to the bit line.

17. The nonvolatile memory cell array of claim 14, wherein a reset operation of the first unit cell among the first to fourth unit cells is performed by applying a word line voltage for forming the first and second channels to the first word line, by applying a ground voltage to the second word line, by applying a reset voltage and the ground voltage to the first source line and the bit line, respectively, and by electrically floating the second source line.

18. The nonvolatile memory cell array of claim 14, wherein a reset operation of the first and second unit cells sharing the first word line among the first to fourth unit cells is performed by applying a word line voltage for forming the first and second channels to the first word line, by applying a ground voltage to the second word line, by applying a reset voltage to the first and second source lines, and by applying the ground voltage to the bit line.

19. The nonvolatile memory cell array of claim 14, wherein a read operation of the first unit cell among the first to fourth unit cells is performed by applying a word line voltage for forming the first and second channels to the first word line, by applying a ground voltage to the second word line, by applying a read voltage and the ground voltage to the first source line and the bit line, respectively, and by electrically floating the second source line.

\* \* \* \* \*